United States Patent
Brady et al.

(10) Patent No.: US 12,087,573 B2
(45) Date of Patent: Sep. 10, 2024

(54) MODULATION OF OXIDATION PROFILE FOR SUBSTRATE PROCESSING

(71) Applicant: Lam Research Corporation, Fremont, CA (US)

(72) Inventors: Gerald Joseph Brady, Glen Ellyn, IL (US); Kevin M. McLaughlin, Sherwood, OR (US); Pratik Sankhe, Wilsonville, OR (US); Bart J. van Schravendijk, Palo Alto, CA (US); Shriram Vasant Bapat, Beaverton, OR (US)

(73) Assignee: Lam Research Corporation, Fremont, CA (US)

(*) Notice: Subject to any disclaimer, the term of this patent is extended or adjusted under 35 U.S.C. 154(b) by 429 days.

(21) Appl. No.: 17/597,593

(22) PCT Filed: Jul. 9, 2020

(86) PCT No.: PCT/US2020/070250
§ 371 (c)(1),
(2) Date: Jan. 12, 2022

(87) PCT Pub. No.: WO2021/011950
PCT Pub. Date: Jan. 21, 2021

(65) Prior Publication Data
US 2023/0005740 A1    Jan. 5, 2023

Related U.S. Application Data

(60) Provisional application No. 62/875,186, filed on Jul. 17, 2019.

(51) Int. Cl.
*H01L 21/02* (2006.01)
*C23C 16/44* (2006.01)
(Continued)

(52) U.S. Cl.
CPC .... *H01L 21/02244* (2013.01); *C23C 16/4408* (2013.01); *C23C 16/45502* (2013.01);
(Continued)

(58) Field of Classification Search
CPC .................................................. H01L 21/02244
See application file for complete search history.

(56) References Cited

U.S. PATENT DOCUMENTS 2,124,940 A    7/1938   Zink
2,679,821 A    6/1954   Kuebler
(Continued)

FOREIGN PATENT DOCUMENTS

CN    1468441 A    1/2004
CN    1777696 A    5/2006
(Continued)

OTHER PUBLICATIONS

Armaou, Antonios, et al., "Plasma enhanced chemical vapor deposition: Modeling and control". Chemical Engineering Science 54 (1999) 3305-3314.
(Continued)

*Primary Examiner* — Peter Bradford
(74) *Attorney, Agent, or Firm* — Weaver Austin Villeneuve & Sampson LLP

(57) ABSTRACT

Methods and apparatuses are provided herein for oxidizing an annular edge region of a substrate. A method may include providing the substrate to a substrate holder in a semiconductor processing chamber, the semiconductor processing chamber having a showerhead positioned above the substrate holder, and simultaneously flowing, while the substrate is supported by the substrate holder, (a) an oxidizing gas around a periphery of the substrate and (b) an inert gas that does not include oxygen through the showerhead and onto the substrate, thereby creating an annular gas region
(Continued)

over an annular edge region of the substrate and an interior gas region over on an interior region of the substrate; the simultaneous flowing is not during a deposition of a material onto the substrate, and the annular gas region has an oxidization rate higher than the interior gas region.

22 Claims, 13 Drawing Sheets

(51) Int. Cl.
    *C23C 16/455*     (2006.01)
    *C23C 16/458*     (2006.01)
    *C23C 16/52*     (2006.01)
    *H10N 50/01*     (2023.01)

(52) U.S. Cl.
    CPC .. *C23C 16/45527* (2013.01); *C23C 16/45565* (2013.01); *C23C 16/4583* (2013.01); *C23C 16/52* (2013.01); *H10N 50/01* (2023.02)

(56) References Cited

U.S. PATENT DOCUMENTS

| | | | |
|---|---|---|---|
| 3,621,812 A | 11/1971 | Hissong, Jr. et al. | |
| 4,673,447 A | 6/1987 | Sakai et al. | |
| 4,961,399 A | 10/1990 | Frijlink | |
| 4,989,541 A | 2/1991 | Mikoshiba et al. | |
| 5,399,254 A | 3/1995 | Geisler et al. | |
| 5,453,124 A | 9/1995 | Moslehi et al. | |
| 5,532,190 A | 7/1996 | Goodyear et al. | |
| 5,580,387 A | 12/1996 | Chen | |
| 5,614,026 A | 3/1997 | Williams | |
| 5,747,362 A | 5/1998 | Visser | |
| 5,789,028 A * | 8/1998 | Zhao | C23C 16/34 427/255.394 |
| 5,871,811 A | 2/1999 | Wang et al. | |
| 5,892,235 A | 4/1999 | Yamazaki et al. | |
| 5,954,881 A | 9/1999 | Burk, Jr. et al. | |
| 6,002,109 A | 12/1999 | Johnsgard et al. | |
| 6,059,885 A | 5/2000 | Ohashi et al. | |
| 6,132,512 A | 10/2000 | Horie et al. | |
| 6,143,081 A | 11/2000 | Shinriki et al. | |
| 6,149,727 A | 11/2000 | Yoshioka et al. | |
| 6,183,563 B1 | 2/2001 | Choi et al. | |
| 6,192,858 B1 | 2/2001 | Nieberding | |
| 6,217,715 B1 | 4/2001 | Sun et al. | |
| 6,285,010 B1 | 9/2001 | Fujikawa et al. | |
| 6,289,842 B1 | 9/2001 | Tompa | |
| 6,302,965 B1 | 10/2001 | Umotoy et al. | |
| 6,333,272 B1 | 12/2001 | McMillin et al. | |
| 6,387,182 B1 | 5/2002 | Horie et al. | |
| 6,403,925 B1 | 6/2002 | Johnsgard et al. | |
| 6,444,039 B1 | 9/2002 | Nguyen | |
| 6,478,872 B1 | 11/2002 | Chae et al. | |
| 6,495,233 B1 | 12/2002 | Shmurun et al. | |
| 6,499,425 B1 | 12/2002 | Sandhu et al. | |
| 6,830,624 B2 | 12/2004 | Janakiraman et al. | |
| 6,849,241 B2 | 2/2005 | Dauelsberg et al. | |
| 6,899,764 B2 | 5/2005 | Frijlink | |
| 6,902,620 B1 | 6/2005 | Omstead et al. | |
| 6,998,014 B2 | 2/2006 | Chen et al. | |
| 7,017,514 B1 | 3/2006 | Shepherd, Jr. et al. | |
| 7,572,337 B2 | 8/2009 | Rocha-Alvarez et al. | |
| 7,622,005 B2 | 11/2009 | Balasubramanian et al. | |
| 7,758,698 B2 | 7/2010 | Bang et al. | |
| 8,092,598 B2 | 1/2012 | Baek et al. | |
| 8,100,081 B1 | 1/2012 | Henri et al. | |
| 8,137,467 B2 | 3/2012 | Meinhold et al. | |
| 8,152,924 B2 | 4/2012 | Dauelsberg et al. | |
| 8,197,636 B2 | 6/2012 | Shah et al. | |
| 8,409,351 B2 | 4/2013 | Robbins et al. | |
| 8,637,411 B2 | 1/2014 | Swaminathan et al. | |
| 8,715,455 B2 | 5/2014 | Brcka | |
| 8,728,956 B2 | 5/2014 | LaVoie et al. | |
| 8,871,654 B2 | 10/2014 | Kato et al. | |
| 8,882,913 B2 | 11/2014 | Byun et al. | |
| 8,956,983 B2 | 2/2015 | Swaminathan et al. | |
| 8,968,512 B2 | 3/2015 | Nishimoto | |
| 8,999,859 B2 | 4/2015 | Swaminathan et al. | |
| 9,388,494 B2 | 7/2016 | Xia et al. | |
| 9,399,228 B2 | 7/2016 | Breiling et al. | |
| 9,449,795 B2 | 9/2016 | Sabri et al. | |
| 9,508,547 B1 | 11/2016 | Pasquale et al. | |
| 9,617,638 B2 | 4/2017 | LaVoie et al. | |
| 9,677,176 B2 | 6/2017 | Chandrasekharan et al. | |
| 9,738,977 B1 | 8/2017 | Karim et al. | |
| 9,793,096 B2 | 10/2017 | Kang et al. | |
| 10,202,691 B2 | 2/2019 | Karim et al. | |
| 10,287,683 B2 | 5/2019 | Xia et al. | |
| 10,316,409 B2 | 6/2019 | Van Schravendijk | |
| 10,407,773 B2 | 9/2019 | LaVoie et al. | |
| 10,665,429 B2 | 5/2020 | Kang et al. | |
| 11,111,581 B2 | 9/2021 | Xia et al. | |
| 11,725,282 B2 | 8/2023 | Xia et al. | |
| 2001/0008205 A1 | 7/2001 | Wilke et al. | |
| 2002/0039625 A1 | 4/2002 | Powell et al. | |
| 2002/0104556 A1 | 8/2002 | Puri et al. | |
| 2003/0019580 A1 | 1/2003 | Strang | |
| 2003/0037802 A1 * | 2/2003 | Nakahara | C23C 16/18 134/1.1 |
| 2003/0054099 A1 | 3/2003 | Jurgensen et al. | |
| 2003/0070620 A1 | 4/2003 | Cooperberg et al. | |
| 2003/0075273 A1 | 4/2003 | Kilpela et al. | |
| 2003/0077388 A1 | 4/2003 | Byun | |
| 2003/0153177 A1 | 8/2003 | Tepman et al. | |
| 2003/0192476 A1 | 10/2003 | Fork et al. | |
| 2003/0194493 A1 | 10/2003 | Chang et al. | |
| 2004/0011286 A1 | 1/2004 | Kwon | |
| 2004/0033310 A1 | 2/2004 | Sarigiannis et al. | |
| 2004/0168769 A1 | 9/2004 | Matsuoka et al. | |
| 2004/0180553 A1 | 9/2004 | Park et al. | |
| 2004/0187779 A1 | 9/2004 | Park et al. | |
| 2004/0216668 A1 | 11/2004 | Lindfors et al. | |
| 2004/0216844 A1 | 11/2004 | Janakiraman et al. | |
| 2005/0118737 A1 * | 6/2005 | Takagi | H01J 37/3244 118/724 |
| 2005/0263072 A1 | 12/2005 | Balasubramanian et al. | |
| 2005/0263248 A1 | 12/2005 | Rocha-Alvarez et al. | |
| 2005/0263484 A1 | 12/2005 | Park et al. | |
| 2005/0268856 A1 | 12/2005 | Miller et al. | |
| 2006/0090705 A1 | 5/2006 | Kim | |
| 2006/0130756 A1 | 6/2006 | Liang et al. | |
| 2006/0196420 A1 | 9/2006 | Ushakov et al. | |
| 2006/0196603 A1 | 9/2006 | Lei et al. | |
| 2006/0213439 A1 | 9/2006 | Ishizaka | |
| 2006/0263522 A1 | 11/2006 | Byun | |
| 2007/0293043 A1 | 12/2007 | Singh et al. | |
| 2008/0121177 A1 | 5/2008 | Bang et al. | |
| 2008/0121179 A1 | 5/2008 | Park et al. | |
| 2008/0124944 A1 | 5/2008 | Park et al. | |
| 2008/0173401 A1 | 7/2008 | Jeon | |
| 2008/0185104 A1 | 8/2008 | Brcka | |
| 2008/0185284 A1 | 8/2008 | Chen et al. | |
| 2008/0188087 A1 | 8/2008 | Chen et al. | |
| 2008/0241384 A1 | 10/2008 | Jeong et al. | |
| 2008/0280068 A1 | 11/2008 | Ahn | |
| 2008/0308040 A1 | 12/2008 | Dauelsberg et al. | |
| 2009/0038541 A1 | 2/2009 | Robbins et al. | |
| 2009/0056629 A1 | 3/2009 | Katz et al. | |
| 2009/0095219 A1 | 4/2009 | Meinhold et al. | |
| 2009/0095220 A1 | 4/2009 | Meinhold et al. | |
| 2009/0109595 A1 | 4/2009 | Herchen et al. | |
| 2009/0138541 A1 | 5/2009 | Wing et al. | |
| 2009/0159424 A1 | 6/2009 | Liu et al. | |
| 2009/0233434 A1 | 9/2009 | Kim et al. | |
| 2009/0270849 A1 | 10/2009 | Truckai et al. | |
| 2010/0003406 A1 | 1/2010 | Lam et al. | |
| 2010/0048028 A1 | 2/2010 | Rasheed et al. | |
| 2010/0055315 A1 | 3/2010 | Honma | |
| 2010/0055342 A1 | 3/2010 | Chiang et al. | |
| 2010/0078578 A1 | 4/2010 | Schuermann et al. | |
| 2010/0096083 A1 * | 4/2010 | Matsumoto | C23C 16/455 118/713 |

(56) References Cited

U.S. PATENT DOCUMENTS

| | | | |
|---|---|---|---|
| 2010/0273291 A1 | 10/2010 | Kryliouk et al. |
| 2010/0288728 A1 | 11/2010 | Han et al. |
| 2011/0195202 A1 | 8/2011 | Dahm |
| 2011/0198417 A1 | 8/2011 | Detmar et al. |
| 2011/0253044 A1 | 10/2011 | Tam et al. |
| 2011/0300695 A1 | 12/2011 | Horii et al. |
| 2012/0009802 A1 | 1/2012 | LaVoie et al. |
| 2012/0043198 A1 | 2/2012 | Yamazaki |
| 2012/0161405 A1 | 6/2012 | Mohn et al. |
| 2012/0269968 A1 | 10/2012 | Rayner, Jr. |
| 2012/0318025 A1 | 12/2012 | Milicevic et al. |
| 2013/0092086 A1 | 4/2013 | Keil et al. |
| 2013/0171834 A1 | 7/2013 | Haverkamp et al. |
| 2013/0341433 A1 | 12/2013 | Roy et al. |
| 2013/0344245 A1 | 12/2013 | Xia et al. |
| 2014/0011369 A1 | 1/2014 | Kato et al. |
| 2014/0044889 A1 | 2/2014 | Qi et al. |
| 2014/0072726 A1 | 3/2014 | Kim |
| 2014/0123900 A1 | 5/2014 | Wang et al. |
| 2014/0179114 A1 | 6/2014 | Van Schravendijk |
| 2014/0209562 A1 | 7/2014 | LaVoie et al. |
| 2014/0217193 A1 | 8/2014 | Breiling et al. |
| 2014/0235069 A1 | 8/2014 | Breiling et al. |
| 2014/0238608 A1 | 8/2014 | Sabri et al. |
| 2015/0007770 A1 | 1/2015 | Chandrasekharan et al. |
| 2015/0017812 A1 | 1/2015 | Chandrasekharan et al. |
| 2015/0030766 A1 | 1/2015 | Lind et al. |
| 2015/0048739 A1 | 2/2015 | Forster et al. |
| 2015/0136028 A1 | 5/2015 | Park et al. |
| 2015/0147889 A1 | 5/2015 | Yudovsky et al. |
| 2015/0155157 A1 | 6/2015 | Song et al. |
| 2015/0167168 A1 | 6/2015 | Keshavamurthy et al. |
| 2015/0194298 A1 | 7/2015 | Lei et al. |
| 2015/0200110 A1 | 7/2015 | Li et al. |
| 2015/0243490 A1 | 8/2015 | Ryu et al. |
| 2015/0262792 A1 | 9/2015 | Bera |
| 2015/0275364 A1 | 10/2015 | Thompson et al. |
| 2015/0299855 A1 | 10/2015 | Yudovsky et al. |
| 2015/0299909 A1 | 10/2015 | Mizuno et al. |
| 2015/0368798 A1 | 12/2015 | Kwong |
| 2015/0380221 A1 | 12/2015 | Liu et al. |
| 2015/0380281 A1* | 12/2015 | Sriraman ............... H01J 37/321 239/569 |
| 2016/0035566 A1 | 2/2016 | LaVoie et al. |
| 2016/0068953 A1 | 3/2016 | Li et al. |
| 2016/0079036 A1* | 3/2016 | Kang ................. C23C 16/345 118/723 R |
| 2016/0097122 A1 | 4/2016 | Yudovsky et al. |
| 2016/0138160 A1 | 5/2016 | Lambert et al. |
| 2016/0289832 A1 | 10/2016 | Xia et al. |
| 2017/0167017 A1* | 6/2017 | LaVoie .............. H01L 21/0257 |
| 2017/0362713 A1 | 12/2017 | Karim et al. |
| 2018/0012733 A1 | 1/2018 | Phillips et al. |
| 2018/0068833 A1 | 3/2018 | Kang et al. |
| 2019/0271081 A1 | 9/2019 | Xia et al. |
| 2019/0341275 A1* | 11/2019 | Jin ..................... B08B 7/0035 |
| 2021/0381106 A1 | 12/2021 | Xia et al. |
| 2022/0093386 A1* | 3/2022 | Nonomura ........ H01L 21/02181 |

FOREIGN PATENT DOCUMENTS

| | | |
|---|---|---|
| CN | 201343570 Y | 11/2009 |
| CN | 101657565 A | 2/2010 |
| CN | 102087955 A | 6/2011 |
| CN | 102136410 A | 7/2011 |
| CN | 102246274 A | 11/2011 |
| CN | 103003924 A | 3/2013 |
| CN | 103415650 A | 11/2013 |
| CN | 103510072 A | 1/2014 |
| CN | 103526183 A | 1/2014 |
| CN | 105088197 A | 11/2015 |
| CN | 105316651 A | 2/2016 |
| JP | H01309973 A | 12/1989 |
| JP | H05218002 A | 8/1993 |
| JP | H07312348 A | 11/1995 |
| JP | H08115879 A | 5/1996 |
| JP | H08148439 A | 6/1996 |
| JP | 2000297368 A | 10/2000 |
| JP | 2003536272 A | 12/2003 |
| JP | 2005142355 A | 6/2005 |
| JP | 2005303292 A | 10/2005 |
| JP | 2008270748 A * | 11/2008 ....... H01L 21/67023 |
| JP | 2009071017 A | 4/2009 |
| JP | 2009135201 A | 6/2009 |
| JP | 2009149951 A | 7/2009 |
| JP | 2010059522 A | 3/2010 |
| JP | 2010206026 A | 9/2010 |
| JP | 4880175 B2 * | 2/2012 |
| JP | 2014012891 A | 1/2014 |
| JP | 2016021564 A | 2/2016 |
| JP | 2016036020 A | 3/2016 |
| KR | 100453298 B1 | 10/2004 |
| KR | 100616486 B1 | 8/2006 |
| KR | 100634326 B1 | 10/2006 |
| KR | 20070098104 A | 10/2007 |
| KR | 20070112354 A | 11/2007 |
| KR | 100891035 B1 | 3/2009 |
| KR | 20090097735 A | 9/2009 |
| KR | 20100029041 A | 3/2010 |
| KR | 20130133488 A | 12/2013 |
| KR | 20140000447 A | 1/2014 |
| KR | 20140071402 A | 6/2014 |
| KR | 20160017610 A | 2/2016 |
| KR | 20160022256 A | 2/2016 |
| TW | 495801 B | 7/2002 |
| TW | 200932945 A | 8/2009 |
| TW | I423383 B | 1/2014 |
| TW | 201416488 A | 5/2014 |
| TW | 201516174 A | 5/2015 |
| WO | WO-2006088463 A1 | 8/2006 |
| WO | WO-2009029902 A1 | 3/2009 |
| WO | WO-2014092085 A1 | 6/2014 |
| WO | WO-2015161225 A1 | 10/2015 |
| WO | WO-2016040448 A1 | 3/2016 |

OTHER PUBLICATIONS

Chinese First Office Action dated Aug. 31, 2020 issued in CN 201811330813.1.
Chinese First Office Action dated Jan. 2, 2019 issued in CN 201710251738.9.
Chinese First Office Action dated Jul. 3, 2017 issued in CN 201510459965.1.
Chinese First Office Action dated Mar. 1, 2019 issued in CN 201710462095.2.
Chinese First Office Action dated Oct. 31, 2016 issued in CN 201310256636.8.
Chinese Notice of Reexamination dated Jul. 29, 2021 issued in CN 201710462095.2.
Chinese Rejection Decision dated Aug. 1, 2019 issued in CN 201710462095.2.
Choo, J.O., et al., "Development of a spatially controllable chemical vapor deposition reactor with combinatorial processing capabilities". Review of Scientific Instruments 76, 062217 (2005), pp. 1-10.
CN Office Action dated Apr. 7, 2024 in CN Application No. 202211279416.2, with English Translation.
CN Office Action dated Apr. 7, 2024 in CN Application No. 202211279875.0, with English Translation.
CN Office Action dated Dec. 9, 2021, in Application No. CN201710462095.2 with English translation.
CN Office Action dated Jul. 19, 2022, in application No. 201710462095.2 with English translation.
CN Office Action dated Mar. 12, 2024 in CN Application No. 202211279459, with English Translation.
Howling, A.A., et al., "Plasma deposition in an ideal showerhead reactor: a two-dimensional analytical solution". Plasma Sources, Sci. Technol. 21 (2012) 015005 pp. 1-15.
International Preliminary Report on Patentability dated Jan. 27, 2022, for Application No. PCT/US2020/070250.

(56) References Cited

OTHER PUBLICATIONS

International Search Report and Written Opinion dated Nov. 2, 2020 issued in Application No. PCT/US2020/070250.
Japanese Decision to Grant dated May 14, 2019 issued in JP 2017224196.
Japanese First Office Action dated Jun. 30, 2021 issued in JP 2017-113915.
Japanese First Office Action dated Jun. 4, 2019 issued in JP 2015-144504.
Japanese Notice of Reasons for Refusal dated Jul. 17, 2018, issued in Application No. JP 2017-224196.
Japanese Notice of Reasons for Refusal dated Jun. 19, 2020 issued in JP 2019-110244.
Japanese Office Action dated Feb. 22, 2022 issued in JP 2019-110244.
Japanese Office Action dated May 29, 2017 issued in JP 2013-131699.
Japanese Second Office Action dated Feb. 24, 2021, issued in Application No. JP 2019-110244.
Japanese Second Office Action dated Feb. 28, 2022 issued in JP 2017-113915.
Japanese Second Office Action dated Feb. 4, 2020 issued in JP 2015-144504.
JP Office Action dated Feb. 28, 2023, in application No. JP20190110244 with English translation.
JP Office Action dated Jul. 25, 2023 in Application No. JP2022-105213 with English Translation.
JP Office Action dated Jun. 14, 2022 in Application No. JP20200138491.
JP Office Action dated Mar. 1, 2022, in Application No. JP2017-113915 with English translation.
JP Office Action dated Mar. 1, 2022, in Application No. JP2019-110244 with English translation.
JP Office Action dated Oct. 12, 2021, in application No. JP2019110244.
JP Office Action dated Oct. 19, 2021, in application No. JP2020138491 with English translation.
Korean First Office Action dated Nov. 23, 2020 issued in KR 10-2020-0146249.
Korean Notice of Allowance dated Aug. 6, 2020 issued in KR 10-2013-0072651.
Korean Office Action dated Mar. 25, 2020 issued in KR 10-2013-0072651.
KR Office Action dated Apr. 21, 2022, in application No. KR1020210112067 with English translation.
KR Office Action dated Aug. 8, 2022, in Application No. KR10-2022-0089613 with English translation.
KR Office Action dated Dec. 9, 2022, in Application No. KR10-2022-0128950 With English Translation.
KR Office Action dated Feb. 7, 2023 in Application No. KR10-2022-0055269 with English translation.
KR Office Action dated Feb. 8, 2022, in Application No. KR1020210166181 with English translation.
KR Office Action dated Jul. 13, 2022 in Application No. KR10-2015-0103671 With English Translation.
KR Office Action dated May 25, 2023, in Application No. KR10-2016-0103783 with English translation.
KR Office Action dated Nov. 22, 2021, in Application No. KR1020150103671 with English translation.
KR Office Action dated Oct. 22, 2021, in application No. KR10-2021-0112067 with English Translation.
Search Report and Written Opinion corresponding to Singapore Application No. 201304839-2 dated Nov. 4, 2014.
SG Office Action dated May 18, 2022, in Application No. SG10202012689Y.
SG Written Opinion dated Nov. 9, 2023, in SG Application No. 10202012689Y.
Taiwanese First Office Action dated Apr. 30, 2020 issued in TW 105126033.
Taiwanese First Office Action dated Dec. 14, 2020, issued in Application No. TW 106119409.
Taiwanese Notice of Allowance and Search Report dated Jul. 25, 2019 issued in TW 108108815.
Terry Day, "The Coanda Effect and Lift. Copyright 2008." pp. 1-27. URL:https://basedados.aeroubi.pt/pluginfile.php/1169/mod_resource/content/0/THE_COANDA_EFFECT_AND_LIFT.pdf.
Translation of the Notification of Examination Opinion dated Sep. 25, 2017, corresponding to Taiwanese Patent Application No. 105137740.
US Final Office Aciton dated Dec. 18, 2014 issued in U.S. Appl. No. 13/659,231.
US Final Office Action dated Jul. 6, 2018 issued in U.S. Appl. No. 15/636,128.
US Notice of Allowance dated Apr. 14, 2017 issued in U.S. Appl. No. 15/186,275.
US Notice of Allowance dated Dec. 19, 2018 issued in U.S. Appl. No. 15/177,548.
US Notice of Allowance dated Feb. 24, 2017 issued in U.S. Appl. No. 14/447,203.
US Notice of Allowance dated Jul. 20, 2016 issued in U.S. Appl. No. 14/828,291.
US Notice of Allowance dated Jul. 29, 2016 issued in U.S. Appl. No. 14/447,203.
US Notice of Allowance dated Mar. 17, 2016 issued in U.S. Appl. No. 13/659,231.
U.S. Notice of Allowance dated Mar. 27, 2023 in U.S. Appl. No. 17/445,562.
US Notice of Allowance dated May 1, 2019 issued in U.S. Appl. No. 15/445,632.
US Notice of Allowance dated May 26, 2021 issued in U.S. Appl. No. 16/410,057.
US Notice of Allowance dated Nov. 8, 2016 issued in U.S. Appl. No. 14/447,203.
US Notice of Allowance dated Sep. 21, 2018 issued in U.S. Appl. No. 15/636,128.
US Office Action dated Dec. 15, 2015 issued in U.S. Appl. No. 14/447,203.
US Office Action dated Jan. 18, 2018 issued in U.S. Appl. No. 15/636,128.
US Office Action dated Jul. 17, 2014 issued in U.S. Appl. No. 13/659,231.
US Office Action dated Nov. 13, 2020 issued in U.S. Appl. No. 16/410,057.
US Office Action dated Nov. 2, 2018 issued in U.S. Appl. No. 15/445,632.
US Office Action dated Nov. 22, 2016 issued in U.S. Appl. No. 15/186,275.
US Office Action dated Sep. 7, 2018 issued in U.S. Appl. No. 15/177,548.

* cited by examiner

MODULATION OF OXIDATION PROFILE FOR SUBSTRATE PROCESSING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor fabrication often involves performing multiple and sequential deposition and etching operations on a substrate to form desired structures. The substrate may be treated in between some of these operations in order to prepare the substrate for subsequent processing. Methods and techniques are sought to use these treatments to reduce substrate defects that may be caused by the sequential operations.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some embodiments, a method for oxidizing an annular edge region of a substrate may be provided. The method may include providing the substrate to a substrate holder in a semiconductor processing chamber, the semiconductor processing chamber having a showerhead positioned above the substrate holder, and simultaneously flowing, while the substrate is supported by the substrate holder, (a) an oxidizing gas around a periphery of the substrate and (b) an inert gas that does not include oxygen through the showerhead and onto the substrate, thereby creating an annular gas region over an annular edge region of the substrate and an interior gas region over on an interior region of the substrate. The simultaneous flowing may not be during a deposition of a material onto the substrate, and the annular gas region may have an oxidization rate higher than the interior gas region.

In some embodiments, the method further includes evacuating, during the simultaneous flowing of the oxidizing gas and the inert gas, gases from the processing chamber.

In some embodiments, the oxidizing gas may include oxygen. In some embodiments, the oxidizing gas may include only oxygen.

In some embodiments, the oxidizing gas may include oxygen and a second inert gas.

In some such embodiments, the second inert gas may be argon, helium, nitrogen, or a combination of two or more thereof.

In some embodiments, the inert gas may be argon, helium, nitrogen, or a combination thereof.

In some embodiments, the method may further include heating, during the simultaneous flowing, the substrate to a first temperature.

In some embodiments, the heating further comprises heating the substrate holder and directly supporting the substrate on a surface of the substrate holder.

In some embodiments, the first temperature is at least 20° C. In some embodiments, the first temperature is at least 200° C. In some embodiments, the first temperature is between about 200° C. and 400° C. In some embodiments, the first temperature is at least 400° C.

In some embodiments, the simultaneous flowing may further include indirectly supporting the substrate on lift pins above a surface of the substrate holder.

In some embodiments, the method may further include flowing, before the simultaneous flowing, the inert gas through the showerhead and onto the substrate while the oxidizing gas is not flowing.

In some embodiments, during the simultaneous flowing a flowrate of the oxidizing gas may be at least 500 standard cubic centimeters per minute (sccm), and a flowrate of the inert gas may be at least 250 sccm.

In some such embodiments, during the simultaneous flowing the flowrate of the inert gas may be at least 500 sccm.

In some embodiments, the simultaneous flowing may not be during a chemical vapor deposition process, or during a dose, purge, or activation step of atomic layer deposition. In some embodiments, the simultaneous flowing is not during a chemical vapor deposition process, or during a dose, purge, or activation step of atomic layer deposition.

In some embodiments, flowing the oxidizing gas may further include flowing the oxidizing gas onto a baffle plate positioned vertically between a top of the processing chamber and the showerhead.

In some embodiments, the method may further include purging, after the simultaneous flowing, the processing chamber of the oxidizing gas, and performing, after the purging, one or more deposition operations on the substrate.

In some embodiments, a semiconductor processing system may be provided. The system may include a processing chamber, a gas delivery system with an inert gas inlet configured to be fluidically connectable with an inert gas source, an oxidizing gas inlet configured to be fluidically connectable with an oxidizing gas source, and one or more valves configured to control flow of the inert gas and the oxidizing gas, a substrate holder configured to support a substrate, a showerhead positioned above the substrate holder and fluidically connected to the inert gas inlet, a substrate handling robot configured to provide the substrate to the substrate holder, a periphery gas flow unit configured to cause an oxidizing gas supplied via the oxidizing gas inlet to flow around a periphery of the substrate holder, the periphery gas flow unit fluidically connected to the oxidizing gas inlet, and a controller comprising machine-readable, non-transitory media containing instructions. The instructions may be for causing the substrate handling robot to provide the substrate to the substrate holder such that the substrate is directly or indirectly supported by the substrate holder, and causing, while the substrate is supported by the substrate holder, the one or more valves to cause a simultaneous flow of (a) the oxidizing gas around the periphery of the substrate and (b) an inert gas that does not contain oxygen through the showerhead and onto the substrate, to thereby create an annular gas region over an annular edge region of the substrate and an interior gas region over an interior region of the substrate. The simultaneous flow may not be during a deposition of a material onto the substrate, and the annular gas region may have an oxidization rate higher than the interior gas region.

In some embodiments, the system may further include a pump configured to evacuate gases from the processing chamber, and the controller may further include instructions for causing the pump to evacuate, during the simultaneous flowing, gases from the processing chamber.

In some such embodiments, the controller may further include instructions for causing the pump to evacuate, after the simultaneous flowing, gases from the processing chamber, and causing the system to perform, after the evacuation, one or more deposition operations on the substrate.

In some embodiments, the substrate holder may include a substrate support surface and lift pins configured to hold the substrate above the substrate support surface, and the controller may further include instructions for positioning the substrate with the lift pins above the substrate support surface during the simultaneous flowing.

In some embodiments, the substrate holder may include a substrate support surface, and the controller may further include instructions for positioning the substrate on the substrate support surface during the simultaneous flowing.

In some such embodiments, the substrate holder may further include a heater configured to heat the substrate positioned on the substrate support surface, and the controller may further include instructions for heating the substrate during the simultaneous flowing and while the substrate is positioned on the substrate support surface.

In some embodiments, the controller may further include instructions for flowing, before the simultaneous flowing, the inert gas through the showerhead and onto the substrate.

In some embodiments, the periphery gas flow unit may include a baffle plate vertically interposed between a body of the showerhead and a top of the chamber, and a gas injector fluidically connected to the oxidizing gas source and configured to flow the oxidizing gas onto the baffle plate.

In some embodiments, the periphery gas flow unit may include gas injectors that are fluidically connected to the oxidizing gas source, extend through the side of the processing chamber, and are configured to flow oxidizing gas around the periphery of the substrate holder.

In some embodiments, the oxidizing gas may include oxygen. In some embodiments, the oxidizing gas may include only oxygen.

In some embodiments, the oxidizing gas may include oxygen and a second inert gas.

In some such embodiments, the second inert gas may be argon, helium, nitrogen, or a combination of two or more thereof.

In some embodiments, the inert gas may be argon, helium, nitrogen, or a combination thereof.

In some embodiments, the gas delivery system may be configured to flow the oxidizing gas into the processing chamber at a flowrate of at least 500 standard cubic centimeters per minute (sccm), and flow the inert gas out of the showerhead at a flowrate of at least 250 sccm.

In some such embodiments, the flowrate of the inert gas may be at least 500 sccm.

In some embodiments, the simultaneous flow of (a) and (b) is not during a chemical vapor deposition process, or during a dose, purge, or activation step of atomic layer deposition.

In some embodiments, the system may further include a pump configured to purge the processing chamber, and the controller may further comprises instructions for causing the pump to purge, after the simultaneous flowing, the processing chamber of the oxidizing gas, and causing the system to perform, after the purging, one or more deposition operations on the substrate.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Figure 1:
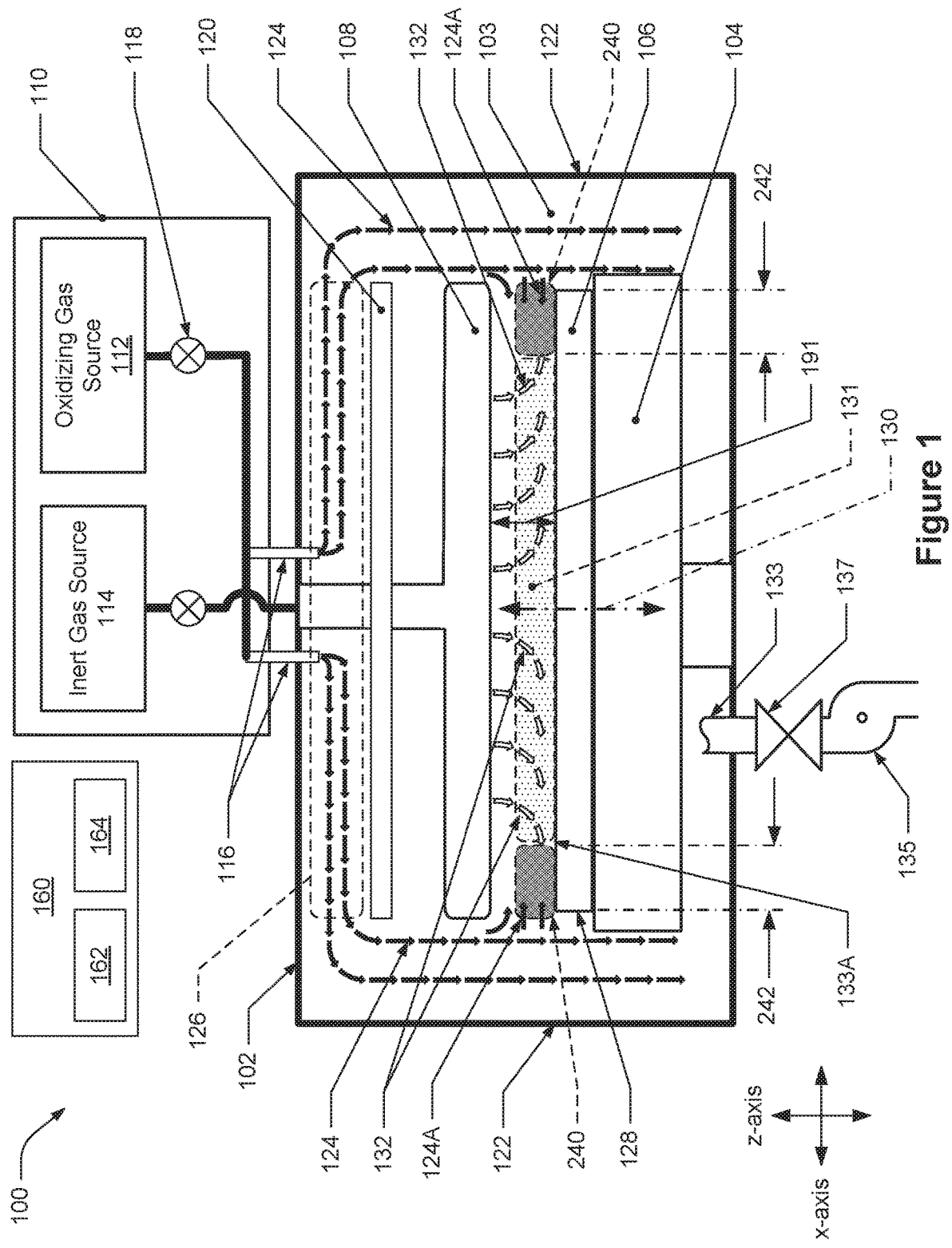
FIG. 1 depicts an example single-station substrate processing apparatus in accordance with disclosed embodiments.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Introduction and Context

Manufacturing of semiconductor devices commonly requires sequential deposition and etching operations in order to create the desired structures on a substrate. Deposition operations deposit one or more layers of a material onto a substrate using various techniques, such as chemical vapor deposition ("CVD"), plasma-enhanced CVD ("PECVD"), atomic layer deposition ("ALD"), low pressure CVD, ultra-high CVD, and physical vapor deposition ("PVD"). CVD processes deposit a film on a wafer surface by flowing one or more gas reactants (also called precursors) into a reactor where they react, optionally with the assistance of a plasma as in PECVD, to form a product (typically the film) on a substrate surface. In ALD processes, precursors are transported to the wafer surface where they are adsorbed by the wafer and then converted by a chemical or physico-chemical reaction to form a thin film on the substrate. A plasma may be present in the chamber to facilitate the reaction. ALD processes employ multiple film deposition cycles, each producing a "discrete" film thickness. A typical ALD cycle generally includes the following steps: (1) exposure of the substrate surface to a first precursor, (2) purge of the reaction chamber in which the substrate is located, (3) activation of a reaction of the substrate surface, optionally by exposure to high temperature and/or a plasma, and/or by exposure to a second precursor, and (4) purge of the reaction chamber in which the substrate is located.

Semiconductor fabrication processes also involve patterning and etching of various materials, including conductors, semiconductors, and dielectrics. Some examples include conductors, such as metals or carbon; semiconductors, such as silicon or germanium; and dielectrics, such as silicon oxide, aluminum dioxide, zirconium dioxide, hafnium dioxide, silicon nitride, and titanium nitride. Etching operations partly or wholly remove one or more materials from a substrate. Example etching operations include plasma etching, atomic layer etching which remove thin layers of material using sequential self-limiting reactions, and ion beam etching.

With the move from planar to 3D transistor structures (e.g., FinFET gate structures for logic devices) and advanced memory structures such as Magnetoresistive Random Access Memory (MRAM) and Resistive Random Access Memory (ReRAM), etching processes need to be increasingly precise and uniform in order to produce quality products. One problem with conventional etching techniques is that etching byproducts, instead of being swept away, are sometimes re-deposited on surfaces where such deposition is not desired. For example, the byproducts may deposit near the edge of the substrate. The byproducts are often metallic or metal rich films. This redeposition phenomenon is particularly problematic when etching non-volatile substances, which is often the case when fabricating advanced devices such as MRAM, ReRAM, cross point memory devices, etc.

Unwanted etching byproduct deposition on the substrate can cause many problems including poor etch results and sub-standard devices. It has been found that some etching techniques result in metallic redeposition in an outer, annular region of a wafer, such as the edge region which may be considered an annular region that includes the outer circular edge (or substantially circular, such as within +/−5% of circular) of the substrate and extends radially inwards for a particular distance, such as about 5 millimeters or 3 millimeters. This metallic byproduct deposition may cause electrical problems, especially where the structure being etched has interleaving layers of dielectric and conductive films. In some cases, unwanted metallic material may deposit on the outer radial end of an etched stack, thereby forming an electrical connection between layers that are supposed to be electrically insulated. This connection creates a short circuit in the stack and may result in failure of the device. One example of this type of failure is a short that forms across a magnetic tunnel junction (MTJ) barrier of an MRAM device.

Thus, there exists a need for improved semiconductor fabrication methods and apparatus which remove the effects of unwanted material on a semiconductor substrate, especially material in the outer, edge region of the substrate, after the substrate has been etched.

Oxidizing unwanted metals and metal rich materials on the substrate may remove their adverse effects by transforming these unwanted metals and metal rich materials into dielectrics, thereby neutralizing them and preventing them from causing a short. However, flowing an oxidizing gas over an entire wafer to oxidize and neutralize the unwanted metals and metal rich materials in the outer annular region of the wafer may damage and ruin the wafer by oxidizing and/or over-oxidizing the wafer interior. As stated above, the wafer interior may have etched features, such as MRAM stacks, that intentionally include numerous metals and the oxidization or over-oxidization of these metals can adversely affect these stacks by increasing their resistance and damaging their performance. Oxidizing the entire wafer surface for the time required to oxidize the metals in the annular edge region may thus adversely affect and damage these stacks by oxidizing or over-oxidizing these metals in the wafer interior. It is therefore desirable to oxidize only the area of the wafer that contains the unwanted metals in order to prevent the unwanted oxidization and over-oxidization of the wafer interior.

Described herein are apparatuses and techniques for neutralizing the effects of unwanted metals and metal rich materials in the outer annular region of a substrate by selectively oxidizing the outer annular substrate region. The apparatuses and techniques include flowing an oxygen-containing gas (referred to herein as an "oxidizing gas") around the periphery of a pedestal containing a wafer while simultaneously flowing an inert gas through a showerhead and onto the wafer; this inert gas flowed through the showerhead does not contain any oxygen. This simultaneous dual gas flow creates a high oxygen concentration in an annular gas region around and on top of the annular edge region of the wafer containing the unwanted materials, and an interior gas region with a low oxygen concentration on top of the wafer interior. The annular gas region has a higher oxidation rate than the interior gas region which allows for selective and greater oxidation of metals and metal rich materials in the wafer's outer annular region, and a low or non-existent oxidization rate on the wafer interior. The inert gas flow through the showerhead creates the interior gas volume which acts as a gas barrier against the oxygen and prevents or hinders the oxygen from flowing radially inwards across the wafer, including over the wafer interior. In some instances, a pump evacuates gases from the bottom of the chamber and this pumping may draw or pull the oxidizing gas downwards in the chamber and create a uniform flow of oxidizing gas around the substrate and substrate holder; the oxidizing gas is transported via diffusion radially inwards along the substrate.

First Example Processing Apparatus

The apparatuses disclosed herein are configured to simultaneously flow both an oxidizing gas around the periphery of a substrate holder and the gap between a showerhead and the substrate holder (hereinafter referred to as the "substrate holder-showerhead gap" or the "gap"), and an inert gas through the showerhead over that substrate holder. This may include features and structures within a processing chamber to direct oxidizing gas flow around the periphery of the substrate holder and substrate holder-showerhead gap. FIG. 1 depicts an example single-station substrate processing apparatus in accordance with disclosed embodiments. This apparatus 100 includes a single processing chamber 102 having an interior volume 103 and a single substrate holder 104 (e.g., a pedestal or an electrostatic chuck) on which a substrate 106 is positioned. Also fluidically coupled to the chamber for the delivery of (for example) film precursors, carrier and/or purge and/or process gases, secondary reactants, etc. is gas delivery system 110 fluidically connected to a showerhead 108. Here, the gas delivery system 110 includes an oxidizing gas source 112 and an inert gas source 114; this gas delivery system 110 also may include gas (or liquid) sources, valves, gas lines, and other flow elements configured to transport the gases (or liquids) to the showerhead and process chamber. As depicted in FIG. 1, the apparatus is configured to selectively flow inert gas from the inert gas source 114 to the showerhead 108, and from the showerhead 108 onto the substrate 106 positioned on the substrate holder 104; this inert gas flow from the showerhead 108 onto the substrate 106 is represented by the non-shaded arrows 132. The substrate holder-showerhead gap is identified as item 191. The apparatus schematically illustrated in FIG. 1 may be used to perform any film deposition operations, such as ALD, CVD, or plasma enhanced CVD. For simplicity, other features of the processing apparatus 100 have been omitted from this Figure and are described in more detail below.

The apparatus 100 also includes one or more gas entry ports 116 for flowing the oxidizing gas into the chamber interior 103. These gas entry ports 116 extend through the chamber wall and into the chamber interior 103, and are fluidically connected to the oxidizing gas source 112 such that oxidizing gas may flow from the oxidizing gas source 112 into the chamber interior 103. Each gas entry port 116 is configured to flow gas into the chamber and may be, for instance, a hole, slot, a nozzle, or annulus. In some instances, at least one of the gas entry ports 116 is configured to flow the oxidizing gas into the chamber in a vertical direction or with a vertical directional component (as used herein, a "vertical" direction or movement is in the direction of the z-axis in FIG. 1). In some embodiments, at least one of the gas entry ports 116 may be configured to flow the oxidizing gas into the chamber in a horizontal direction or with a horizontal directional component (as used herein, a "horizontal" direction or movement is in directions parallel to the X-Y plane perpendicular to the z-axis). One or more flow control elements 118 may be positioned on and within the fluidic connection between the oxidizing gas source 112 and the gas entry ports 116 that are configured to control the flow of this gas, such as a valve, restrictor, and/or mass flow controller (MFC).

The apparatus may be configured in various ways to flow the oxidizing gas around the periphery of the substrate. In some embodiments, the apparatus may have one or more elements, collectively referred to as a periphery gas flow unit, that are configured to cause an oxidizing gas to flow around a periphery of the substrate holder. In some embodiments, the apparatus may have a baffle plate above the showerhead that is configured to direct the flow of the oxidizing gas towards the periphery of the substrate. As illustrated in FIG. 1, the apparatus 100 includes a baffle plate 120 positioned within the interior 103 of the chamber 102, and configured to cause, at least in part, the oxidizing gas to flow around the periphery of the substrate holder 104 and the substrate 106 positioned thereon. This may include positioning the baffle plate 120 underneath the gas entry ports 116 and above the showerhead 108 such that, as indicated by the solid black arrows 124, the oxidizing gas enters the chamber 102 in the region between the top of the chamber and the baffle plate 120, identified as the dotted rectangle 126, is caused to flow radially outwards and horizontally towards the chamber sidewalls 122, vertically down, onto the substrate 106 edge, and radially inwards towards the substrate 106 center. In the embodiment of FIG. 1, the periphery gas flow unit may be considered to include the baffle plate 120 and the gas entry ports 116.

While the black arrows 124 generally depict the flow of the oxidizing gas within the chamber 102, the configuration of the baffle plate 120 and the gas injection ports 116 may vary in order to cause this oxidizing gas flowpath. For example, the baffle plate 120 may be substantially circular (e.g., having an outer perimeter that stays within an annular zone that has an inner radius that is 95% or more of its outer radius) and may have an outer diameter that is substantially equal to (e.g., within 5% of equal) or greater than the outer diameter of the showerhead 108. In some instances, the vertical offset distance between the baffle plate 120 and the top of the chamber may vary, which in turn may affect the gas flow characteristics of gas within this region 126. It may be advantageous in some circumstances to use this baffle plate because it protects the showerhead from unwanted backside deposition, prevents sidewall deposition, reduces defects in the substrate, and also may contribute to uniform gas flow around the substrate holder and the substrate holder-showerhead gap 191. In some embodiments, the gas injection ports 116 may also have different configurations that flow the gas into the region 126 in the chamber 102 in various directions, e.g., vertical or horizontal, which may affect the oxidizing gas flow. For instance, the oxidizing gas contacts and flows along the baffle plate 120 towards the chamber side walls 122.

The apparatus is also configured to cause the oxidizing gas to flow onto the substrate radially inwards from the substrate edge. In some embodiments, this configuration may include just flowing the oxidizing gas around the periphery of the substrate, the periphery of the substrate holder, and the periphery of the substrate holder-showerhead gap which enables the oxidizing gas to flow onto the substrate. In some instances, this configuration may include an exhaust port 133 (or outlet) in the bottom region of the chamber 102 and a pump 135 configured to pump gases out of the chamber 102. The pump 135, e.g., a one or two stage mechanical dry pump and/or turbomolecular pump, may be used to draw gases out of the process chamber 102 and to maintain a suitably low pressure within the process chamber 102 by using a closed-loop-controlled flow restriction device, such as a throttle valve 137 or a pendulum valve. Pumping gases out of the chamber 102 causes, among other things, the oxidizing gas to flow downwards, i.e., in the z-axis, in chamber 102 such that it flows around the showerhead 108, the substrate holder-showerhead gap 191, and the substrate holder 104 as indicated in FIG. 1. With the oxidizing gas flowing vertically downwards around the periphery of the substrate holder 104 and the substrate holder-showerhead gap 191, the oxidizing gas flows radially inwards into the substrate holder-showerhead gap 191, above the substrate 106, and along the substrate 106 through diffusion. As illustrated in FIG. 1, the oxidizing gas 124 flows vertically downwards and also radially inwards, i.e., in the horizontal x-axis direction, as indicated by arrows 124A, from the outer edge 128 of the substrate 106 towards the center 130 of the substrate 106 by diffusion.

Although FIG. 1 is a cross-sectional side view, the apparatus is configured to flow the oxidizing gas uniformly around the entire periphery of the substrate holder and the substrate holder-showerhead gap, and thus around the entire periphery of the substrate on that substrate holder. This uniform flow around the entire periphery of the substrate holder and the substrate holder-showerhead gap, sometimes referred to as a curtain flow of oxidizing gas around the substrate holder, may also be enabled by the baffle plate and the pumping of the gases out of the chamber. In some embodiments, flowing the oxidizing gas onto the baffle plate and drawing it downwards in the chamber with the exhaust pump, causes the oxidizing gas to flow uniformly around the baffle plate and thus uniformly around the showerhead, the substrate holder, the substrate holder-showerhead gap, and the substrate.

Simultaneously flowing the inert gas through the showerhead and onto the substrate along with the oxidizing gas around the substrate periphery assists in creating the annular gas region of oxidizing gas. This inert gas flow creates a barrier over the substrate interior that allows the oxidizing gas to flow over the substrate's annular edge region, but prevents or hinders the oxidizing gas from flowing too far radially inwards and causing unwanted oxidization or over-oxidization on interior region of the substrate. The resulting annular gas region has a high oxygen concentration, and thus a high oxidation rate, on top of the substrate's annular edge region in order to oxidize the unwanted metals in this region. The simultaneous inert gas flow through the showerhead and onto the substrate also prevents the oxidizing gas from flowing too far radially inwards and causing unwanted oxidization or over-oxidization in the interior region of the substrate. As stated herein, the inert gas flowed through the showerhead does not contain any oxygen.

These gas flows are illustrated in FIGS. 1 and 2A-2C. As indicated by the non-shaded arrows 132 in FIG. 1, the inert gas flows through the showerhead 108, onto the substrate 104, and radially outwards away from the substrate center 130 and towards the substrate edge 128. Flowing this inert gas through the showerhead at the same time as the oxidizing gas around the periphery of the substrate (as well as the periphery of the substrate holder-showerhead gap), i.e., these simultaneous gas flows, creates an interior gas region, identified as lightly shaded region 131, over the interior of the wafer that acts a barrier against the oxidizing gas and prevents the oxidizing gas from flowing radially inwards more than is desired. Without this simultaneous radially outward inert gas flow, there is no ability to counteract the oxidizing gas flow and prevent it from flowing too far radially inwards and oxidizing too much of the substrate, and there is limited to no control of the oxidization area on the substrate. This interior gas region 131 has an oxidization rate lower than that of the annular gas region such that limited or no oxidization occurs in this interior gas region.

Figure 2A:
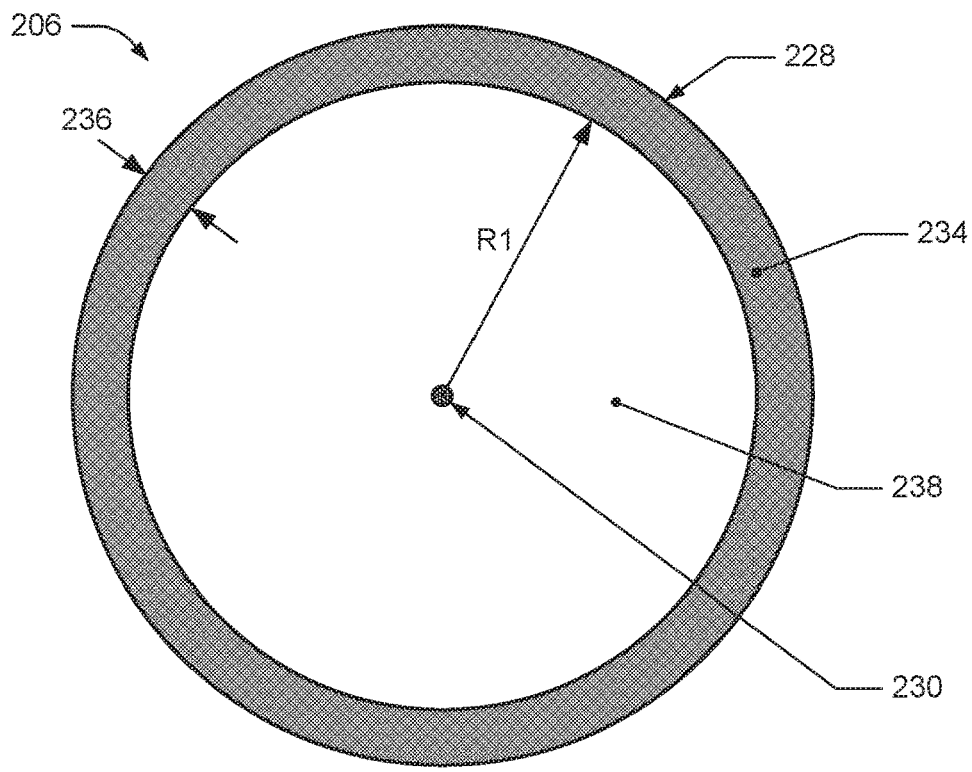
FIGS. 2A and 2B depict a top view of an example substrate.
Figure 2B:
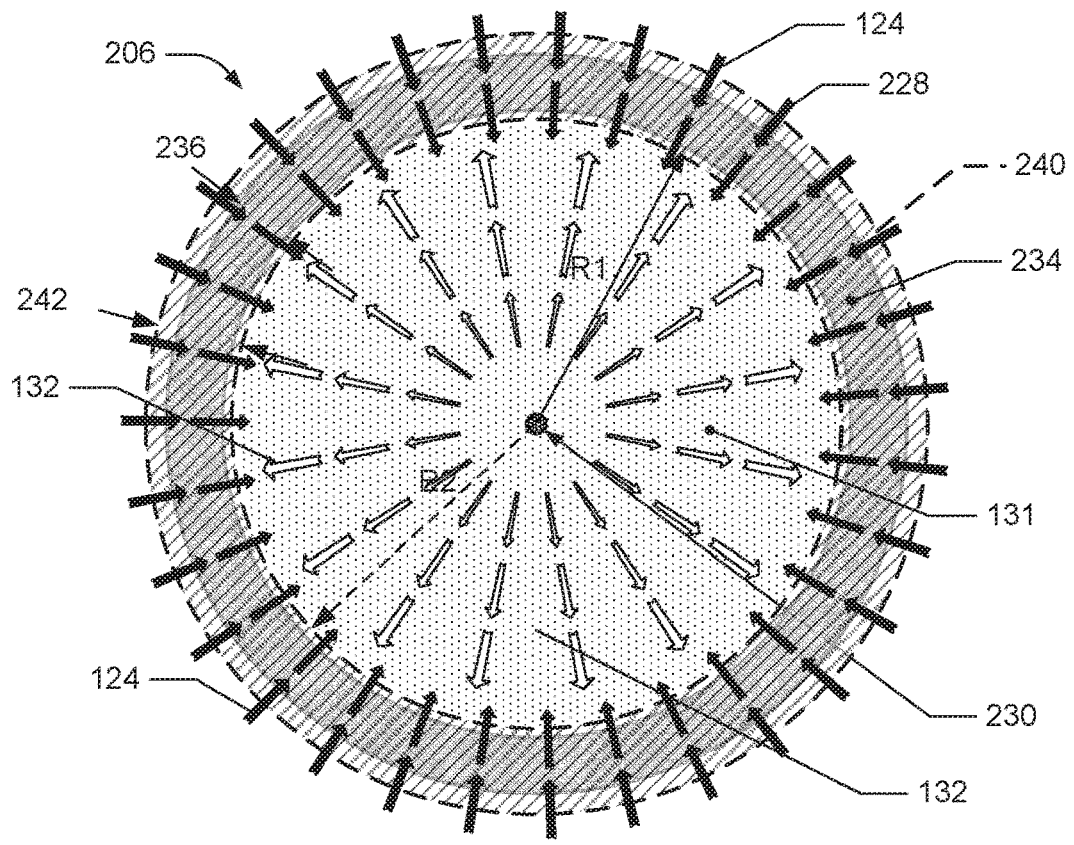

FIGS. 2A and 2B depict a top view of an example substrate. As seen in FIG. 2A, the substrate 206 has an exterior edge 228 that forms a part of the substrate's periphery. The unwanted metal and metal rich materials may exist in the annular edge region 234 (illustrated with dark shading) of the substrate 106 which extends around the substrate center 230 and extends radially inwards from the edge 228 towards the center 230 for a first radial thickness 236 that may be, for instance, 3 mm or 5 mm; the inner radius of this annular edge region 234 is labeled R1. The substrate's interior region 238 is unshaded and may be considered the area in which oxidization or over-oxidization may damage the features on the substrate. It is therefore desirable to create an annular gas region having high oxidization on top of this annular edge region 234 and a region with no or a low oxygen concentration on and around this interior region 238.

FIG. 2B depicts an annular gas region 240 having a high oxygen concentration, i.e., a high oxidization rate, which is illustrated with dashed-line boundaries and semi-transparent cross-hatching. This annular gas region extends around the edge 228 of the substrate 206 and extends radially inwards towards the center 230 for a second radius R2 and therefore may have a radial thickness 242. In some embodiments, like depicted in FIG. 2B, this second radius R2 may be close to, but smaller than, the first radius R1 in order to oxidize all of the annular edge region 234. In some embodiments, the second radius R2 may be larger than the first radius R1 in order to prevent any oxidization of the interior region 238. In some other embodiments, the two radiuses may be equal or substantially equal (e.g., within +/−5% of each other). In some other embodiments, the second radius R2 may be larger than the first radius R1 in order to oxidize just some of the annular edge region 234; this may be advantageous for preventing oxidization to the interior region 238.

In FIG. 2B, the inert gas 132 is seen flowing radially outwards against the radially inward flowing oxidizing gas 124 which together contribute to the creation of the annular gas region 240 having the high oxidization rate, and the interior gas region 131 that has a low oxygen concentration and that is depicted radially inwards from the annular gas region and illustrated with light shading. As stated above, this interior gas region 131 acts as a barrier to prevent the oxidizing gas from flowing radially inwards more than is desired. As also stated above, the oxidizing gas 124 flows radially inwards through diffusion.

Referring back to FIG. 1, two cross-sectional slices of the annular gas region 240 are seen along with a cross-sectional slice of the interior gas region 131 in between these two annular gas region 240 slices. The two annular gas region 240 slices extend radially inwards from the substrate edge 128 towards the substrate center 130 such that they have the radial thickness 242 (also identified in FIG. 2B). The radial flow of the oxidizing gas may be considered to generally stop at the edge of the interior gas region 131.

As can be seen in FIGS. 2A and 2B, and as used herein, annular is used to describe a ring-shaped area or region that has an outer circular circumference and a smaller, inner circular circumference, with an open area radially inwards of the inner circular circumference. In some embodiments, the inner and outer circular circumferences may not be exactly circular and may, in some instances, be substantially circular (e.g., having an outer perimeter that stays within an annular zone that has an inner radius that is 95%, 90%, or 85% or more of its outer radius).

Figure 2C:
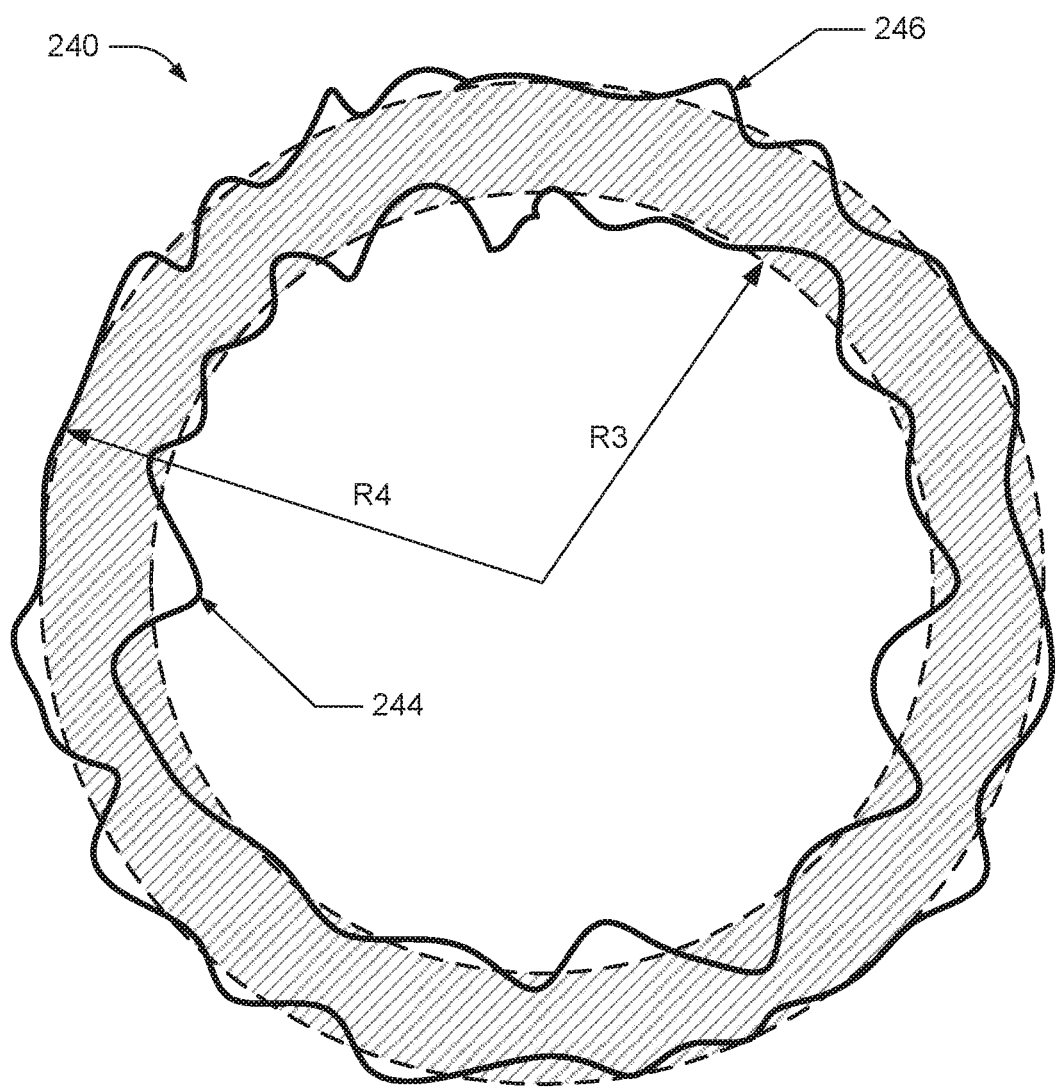
FIG. 2C depicts an annular gas region of FIG. 2B.

Additionally, even though these annular gas regions and regions on the substrate have clearly defined boundaries, in practice and operation these boundaries may not be as exact because of the inexact and imprecise nature of the unwanted materials on the substrate and of gas flows and gas volumes. Accordingly, in some embodiments these annular shapes and radiuses may be considered average nominal radiuses, boundaries, circumferences, and diameters. For instance, an annular gas ring may have a variable inner boundary that is not a perfect circle but can be defined as an average nominal radius and circumference. For instance, as shown in FIG. 2C, the annular gas region of FIG. 2B is depicted. Here, the actual, approximate inner and outer boundaries of the annular gas region 240 are shown and identified as items 244 and 246, respectively. These boundaries are each considered as having average radiuses, R3 and R4, respectively, that represent the average nominal inner and outer radius of the annular gas region 240. Although not depicted in these Figures, the annular edge region of the substrate may also have an imprecise, non-uniform inner boundary.

As described in more detail below, the oxidization rate as well as the size of the annular gas region may be adjusted by adjusting the inert gas flow and the oxidizing gas flow. For instance, decreasing the inert gas flowrate may decrease the annular gas region's inner radius, thereby allowing more oxidizing gas to flow radially inwards (i.e., via diffusion) on the wafer and increasing the annular gas region's radial thickness on the substrate and oxidizing more of the substrate surface.

As also described in more detail below, the semiconductor processing apparatuses described herein may have a controller with program instructions for controlling the features of the apparatus, including for executing one or more of the example techniques described herein. FIG. 1 shows a controller 160 having a processor 162 and a memory device 164, with the controller 160 configured to control any and all aspects of the apparatus 100.

Example Techniques

Figure 3:
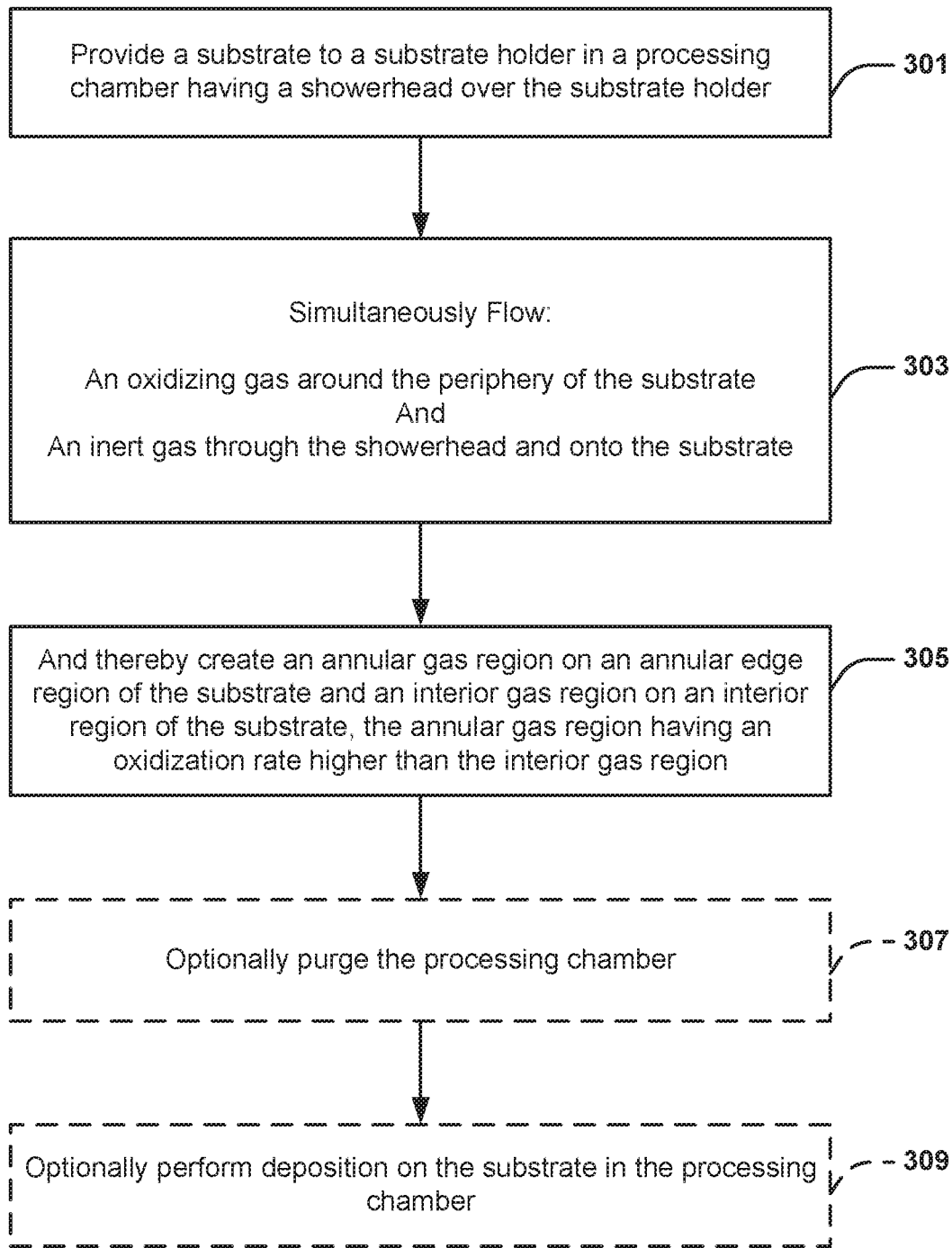
FIG. 3 depicts a first example technique for oxidizing an annular edge region of a substrate.

Various techniques may be used to flow the inert gas and oxidizing gas onto the substrate. FIG. 3 depicts a first example technique for oxidizing an annular edge region of a substrate. In operation 301, a substrate is provided to a substrate holder in a processing chamber. As stated herein, the processing chamber has at least one substrate holder configured to support, directly or indirectly, the substrate. This may include directly supporting the substrate on a support surface of the substrate holder as well as indirectly supporting the substrate above the support surface, such as on lift pins. As also described above, the processing chamber has a showerhead above the substrate holder that is configured to flow process gases onto the substrate that is directly or indirectly supported by the substrate holder.

Once the substrate is directly or indirectly supported by the substrate holder, an oxidizing gas and inert gas may be simultaneously flowed into the process chamber as provided by operation 303. As described above, in this operation the oxidizing gas is flowed around the periphery of the substrate (which may also include the substrate holder-showerhead gap) and the inert gas is simultaneously flowed through the showerhead and onto the substrate. The flow of the oxidizing gas around the periphery of the substrate may be performed in any way described herein, including flowing the oxidizing gas into the chamber and onto a baffle plate as described above and illustrated in FIG. 1. This operation 303 may also include, as discussed herein, simultaneously evacuating gases from the processing chamber in order to draw or pull the oxidizing gas downwards in the processing chamber. In some embodiments, this oxidizing gas may include only molecular oxygen, although in other embodiments it may also include other elements such as one or more generally inert gases including, for instance, argon, helium, nitrogen or a combination thereof. In some embodiments, the inert gas flowed through the showerhead in operation 305 may include argon, helium, nitrogen or a combination thereof; the inert gas flowed through the showerhead in operations 303 and 305 do not include the any oxidizing gas, i.e., it does not contain any oxygen. In some embodiments, during this simultaneous flowing, the substrate is directly supported by a substrate support surface of the substrate holder, while in some other embodiments, the substrate may be supported by lift pins of the substrate holder (and thus indirectly supported by the substrate holder).

These simultaneous gas flows of operation 303 create an annular gas region on the annular edge region of the substrate and an interior gas region on an interior region of the substrate as described above, as represented by operation 305. As also stated above, in some embodiments the creation of the annular gas region of operation 305 may be enabled by the simultaneous evacuation of gases from the processing chamber while both the oxidizing and inert gases are flowed. For instance, as illustrated in FIGS. 2A and 2B, the interior gas region 131 is created over the interior 238 of the substrate while the annular gas region 240 is over the annular edge region 234 of the substrate. This interior gas region 131 has an oxygen concentration, and therefore an oxidation rate, that is less than that of the annular gas region 240 such that limited or no oxidization occurs in this interior gas region 231. The annular gas region 240 oxidizes the annular edge region 234 of the substrate in order to oxidize the unwanted metals and metal containing materials in this annular edge region 234. In some embodiments, the interior gas region may have an oxidization rate gradient that is highest at the oxidizing gas-inert gas interface (i.e., where the oxidizing gas and inert gas meet, identified with identifier 133 in FIG. 1) and lowest at the center of the substrate. Similarly, in some embodiments the annular gas region may have an oxidization rate that is not uniform, e.g., is a gradient, that is highest at the outer edge and lowest at the oxidizing gas-inert gas interface 133A.

In some embodiments, the flowrates of the oxidizing gas and the inert gas may be the same, while in other embodiments they may differ. For example, the oxidizing gas flow rate may be greater than or equal to the inert gas flow rate. In some embodiments, the oxidizing gas may be at least 500 standard cubic centimeters per minute (sccm) and the flowrate of the inert gas may be at least 250 sccm, 300 sccm, 400 sccm, 500 sccm, 1,000 sccm, and 2,000 sccm. As discussed below, the present inventors discovered that the oxidization rate in the annular edge region decreased relative to the interior region as the inert gas flowrate increased. Additionally, the flowrates of the oxidizing gas and inert gas may remain constant during at least a part of operations 403 and 405. These constant flowrates may be advantageous for creating steady state gas regions and conditions which in turn may create more uniform oxidization results on the substrate.

As stated above, operations 303 and 305 are not performed during a deposition step or operation. This includes not performing these operations during a CVD deposition operation, PECVD, or ALD operation, such as a dose, purge, or activation step. In some embodiments, operations 303 and 305 may be considered post-etching steps and/or pre-deposition steps.

In some embodiments, operations 301, 303, and 305 are performed as pre-deposition operations in a processing chamber for CVD deposition, and in some such embodiments, the CVD deposition performed after these three operations may be incompatible with the oxidizing gas. For example, molecular oxygen trapped in channels, lines, and other conduits has the potential to react with precursor gases, such as Silane ($SiH_4$), Ammonia ($NH_3$), and Hydrogen ($H_2$) resulting in unwanted particle formation and unwanted incorporation of $O_2$ into the deposited film. In some instances, $SiH_4$ and $O_2$ will form $SiO_2$ which is a potential unwanted defect source. In order to perform both these pre-deposition and deposition operations having incompatible chemistries in the same processing chamber, a purge operation may be performed to remove the incompatible oxidizing gases and other unwanted materials, such as particulates, from the processing chamber. FIG. 3 further shows this optional purge operation 307 that may be performed after operations 303 and 305. In a purge operation, purge gas, such as inert gas, may be flowed through the showerhead and through the same oxidizing gas flow path into the chamber and out an exhaust port in the chamber. As also illustrated in FIG. 3, the optional deposition operation 309, e.g., CVD deposition, in the same chamber may be performed after operations 303 and 305, and in some embodiments, after optional operation 307.

Figure 3A:
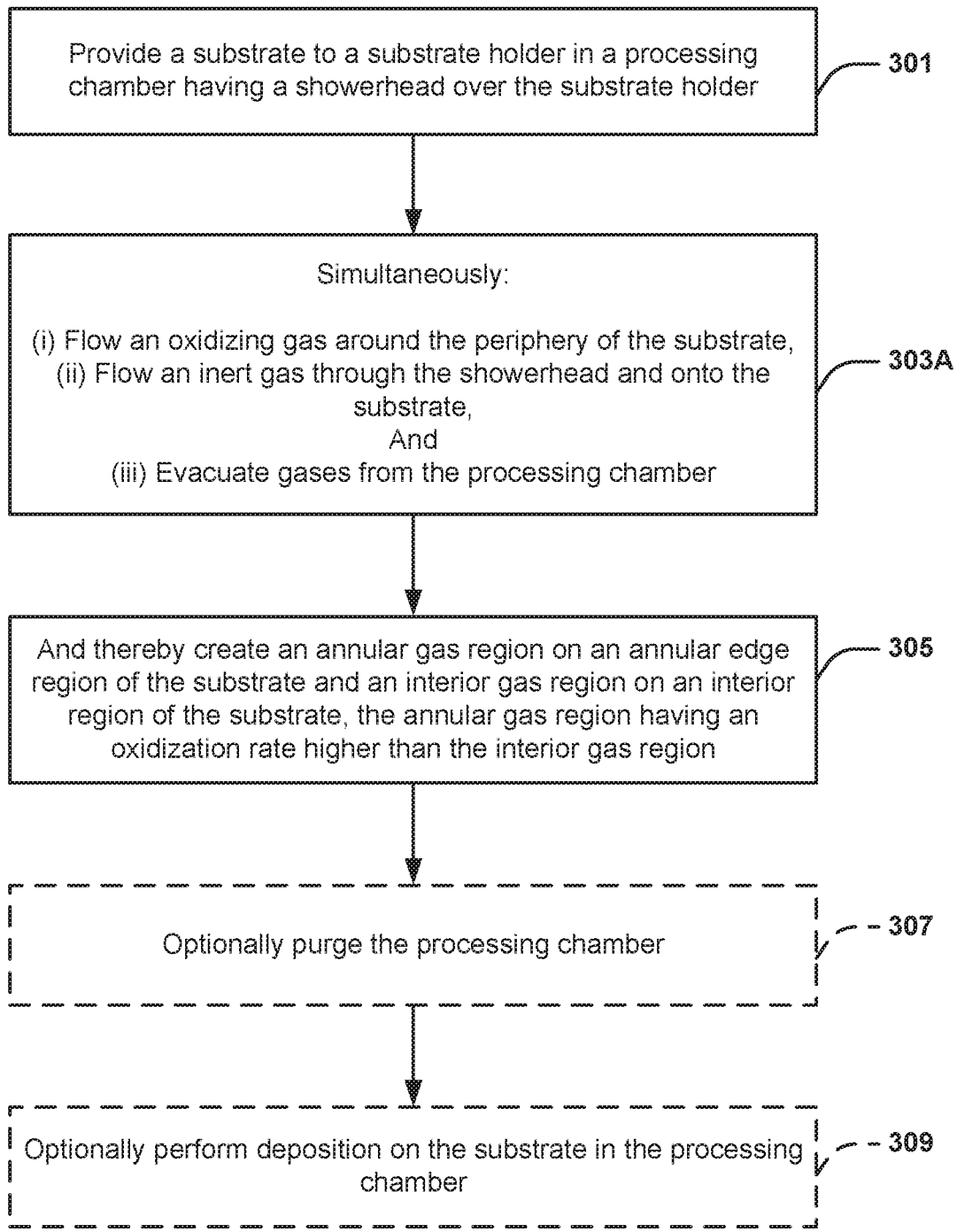
FIG. 3A depicts a second example technique for oxidizing an annular edge region of a substrate.

As stated above, the techniques may include evacuating the gases from the chamber during at least the simultaneous oxidizing and inert gas flows. FIG. 3A depicts a second example technique for oxidizing an annular edge region of a substrate. Here, operation 303A is similar to, but different than, operation 303 of FIG. 3. As can be seen in this operation 303A, the oxidizing gas and the inert gas are flowed simultaneously into the chamber and during this simultaneous gas flow, the gases in the chamber are also simultaneously evacuated from the bottom of the processing chamber. As illustrated in FIG. 1, this chamber evacuation may be performed by the pump 135 that draws gases out of the bottom of the processing chamber 102 which in turn draws the oxidizing gas 124 downwards and uniformly around the baffle plate, the showerhead, the showerhead-substrate holder gap, the substrate, and the substrate holder. The oxidizing gas around the showerhead-substrate holder gap is transported radially inwards over and on the substrate by diffusion. The simultaneous inert and oxidizing gas flows and chamber evacuation assist in creating the annular oxidizing gas region of operation 305. The optional operations 307 and 309 may also be performed in the second example technique of FIG. 3A. In some embodiments, the chamber evacuation by begin before or at the same time as the simultaneous flowing of the oxidizing and inert gases, while in some other embodiments in may begin after the simultaneous flowing of the gases. In some embodiments, the chamber evacuation may continue after the simultaneous flowing of gases stops.

Figure 4:
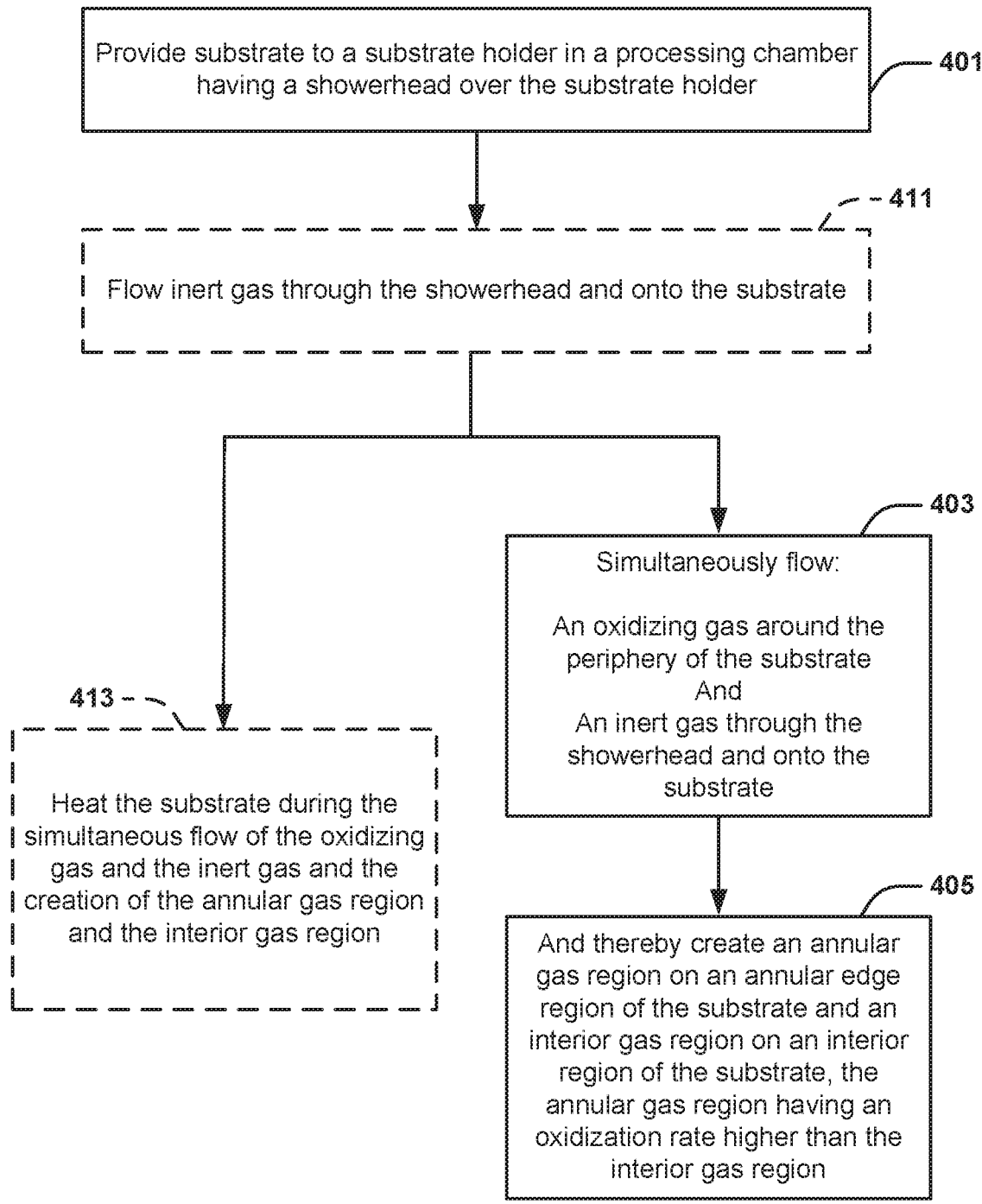
FIG. 4 which depicts a third example technique for oxidizing an annular edge region of a substrate.

The techniques described herein may also include other operations as illustrated in FIG. 4 which depicts a third example technique for oxidizing an annular edge region of a substrate. In some embodiments, the techniques may include a substrate heating operation and/or an inert gas flow operation before the simultaneous flowing of the oxidizing and inert gases. In this third example technique, operations 401, 403, and 405 are the same as operations 301, 303, and 305 in FIG. 3. In some embodiments, although not depicted in FIG. 4, operation 403 of FIG. 4 may be the same as operation 303A of FIG. 3A in which the processing chamber is evacuated during the simultaneous oxidizing and inert gas flows into the processing chamber. In optional operation 411 of FIG. 4, the inert gas may be flowed through the showerhead (without accompanying flow of the oxidizing gas) and onto the substrate before the simultaneous inert and oxidizing gas flow of operations 403 and 405. This may create and position the inert gas barrier over the substrate before the oxidizing gas is flowed which may protect more of the substrate and also allow for more control of the annular gas region over the substrate. In some instances, the flowrate of the inert gas in operation 411 may be the same as in operation 403 while in other embodiments they may be different. For example, the inert gas flow rate may be higher in operation 411 than in operation 403. After operation 411 has been performed for a particular time period, the oxidizing gas flow may begin, thereby beginning operation 403.

In optional operation 413, the substrate may be heated during the simultaneous flow of the inert gas and the oxidizing gas, and the creation of the annular and interior gas regions, of operations 403 and 405. The heating of the substrate may improve the oxidation of the substrate by, for instance, increasing the oxidization rate. The temperature of the substrate during this heating may be at least 20° C. or 23° C., and in some embodiments between about 200° C. and 400° C. In some embodiments, this heating may be achieved by positioning the substrate on the substrate support surface of the substrate holder and heating the substrate holder. This heating of the substrate holder may be achieved by heating the substrate holder with a heating fluid or a resistive heating coil. In some instances in which both operations 411 and 413 are performed, the heating of the substrate in operation 413 may also occur during the inert gas flow of operation 411. In some embodiments, the temperature of the substrate may be adjusted or controlled by adjusting the separation distance between the substrate and the substrate holder by lowering or raising the substrate using the lift pins. For instance, the substrate may be heated to the highest temperature by lowering the substrate onto the substrate holder, and the substrate temperature may be reduced by raising the substrate up with the lift pins such that lower temperatures are achieved with greater separation distances.

As stated above, various process conditions may be adjusted to vary the dimensions and oxidization rate of the annular gas region over the wafer; these conditions include the inert gas flowrate, inert gas partial pressure, inert gas composition, oxidizing gas flowrate, oxidizing gas partial pressure, oxidizing gas composition, and chamber pressure. For example, the oxidization rate of the annular gas region may be adjusted by changing the composition of the oxidizing gas, such as by changing the percentage of molecular oxygen in the oxidizing gas. This may include adding other components to the oxidizing gas, like an inert gas, or removing components so the oxidizing gas contains only molecular oxygen. In some embodiments, the oxidizing gas and inert gas flowrates may be adjusted to make the radial thickness of the annular gas region larger or smaller and/or to make the oxidization rate of the annular gas region higher or lower. For instance, increasing the inert gas flowrate relative to the oxidizing gas flowrate may decrease the radial thickness of the annular gas region and/or decrease the oxidization rate of the annular gas region.

Additional Example Apparatuses and Features

Figure 5:
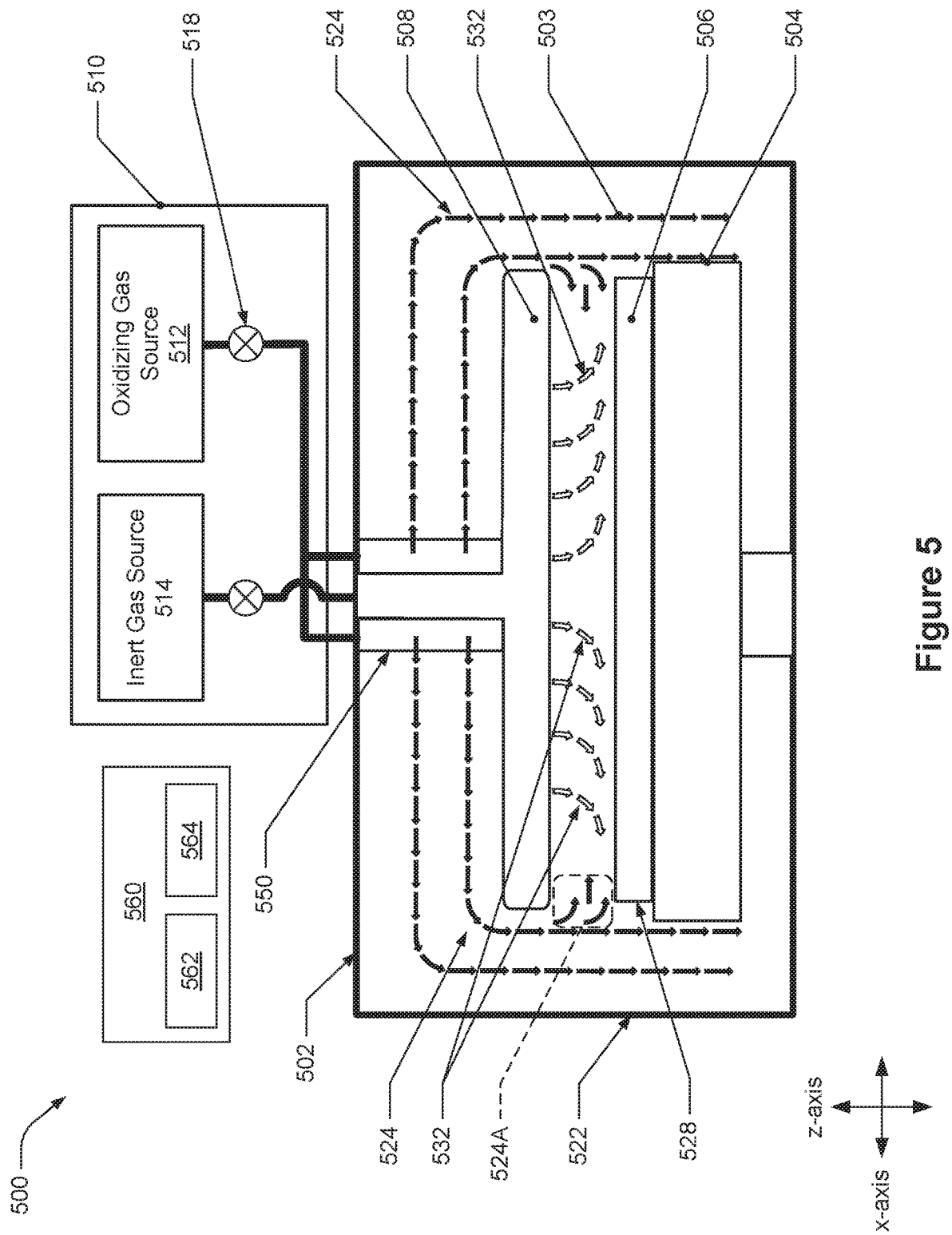
FIG. 5 depicts another example schematic of a substrate processing apparatus.

Additional chamber configurations may be used to flow the oxidizing gas around the periphery of the substrate, e.g., using various configurations of periphery gas flow units. This may include flowing the oxidizing gas through a collar placed around the stem of a chandelier-style showerhead, through the pedestal, and/or through the showerhead. For example, as shown in FIG. 5, which depicts another example schematic of a substrate processing apparatus 500, the apparatus 500 includes a processing chamber 502, a showerhead 508, and a showerhead collar 550 through which the oxidizing gas flows. As described above, the inert gas 532 from the inert gas source 514 is flowed into chamber 502 through the bottom surface of the head portion of showerhead 508, while the oxidizing gas 124 from oxidizing gas source 512 is flowed into chamber 502 through apertures in the showerhead collar 550 which surrounds the stem portion of showerhead 508. The oxidizing gas 524 is introduced into the processing chamber 502 near to the center axis of the backside of the showerhead 508 and introduced with a flow substantially parallel to the plane of the substrate 506 (e.g., in the x-axis) supported by the substrate holder 104 (and substantially parallel to the bottom surface of the head portion of the showerhead 508).

The showerhead collar 550 may have an inner cavity that is cylinder-shaped and that receives the stem portion of the showerhead 508. A plurality of slot-shaped apertures may be formed in the collar to allow a flow of the oxidizing gas from the inner cavity to an outer surface of the showerhead collar.

The oxidizing gas may therefore flow through the apertures in the showerhead collar and into the processing chamber in a direction substantially parallel to the plane of the substrate and also substantially parallel to the plane of the bottom surface of the head portion of the showerhead. In this embodiment, the periphery gas flow unit includes the collar. The gas flow may flow around the showerhead 508 and vertically downwards in the z-direction so that the oxidizing gas flows around the substrate holder-showerhead gap 591, the substrate 506, and the substrate holder 504. The oxidizing gas 524 radially inwards through diffusion as indicated with the arrows encircled by region 524A. Similar to FIG. 1, the oxidizing gas flows uniformly around the showerhead so that a uniform curtain of oxidizing gas forms and flows around the substrate holder-showerhead gap 591, the substrate 506, and the substrate holder 504. In some embodiments, as described above, the formation of the annular gas region may be enabled by the simultaneous evacuation of the chamber with the pump (not depicted).

Figure 6:
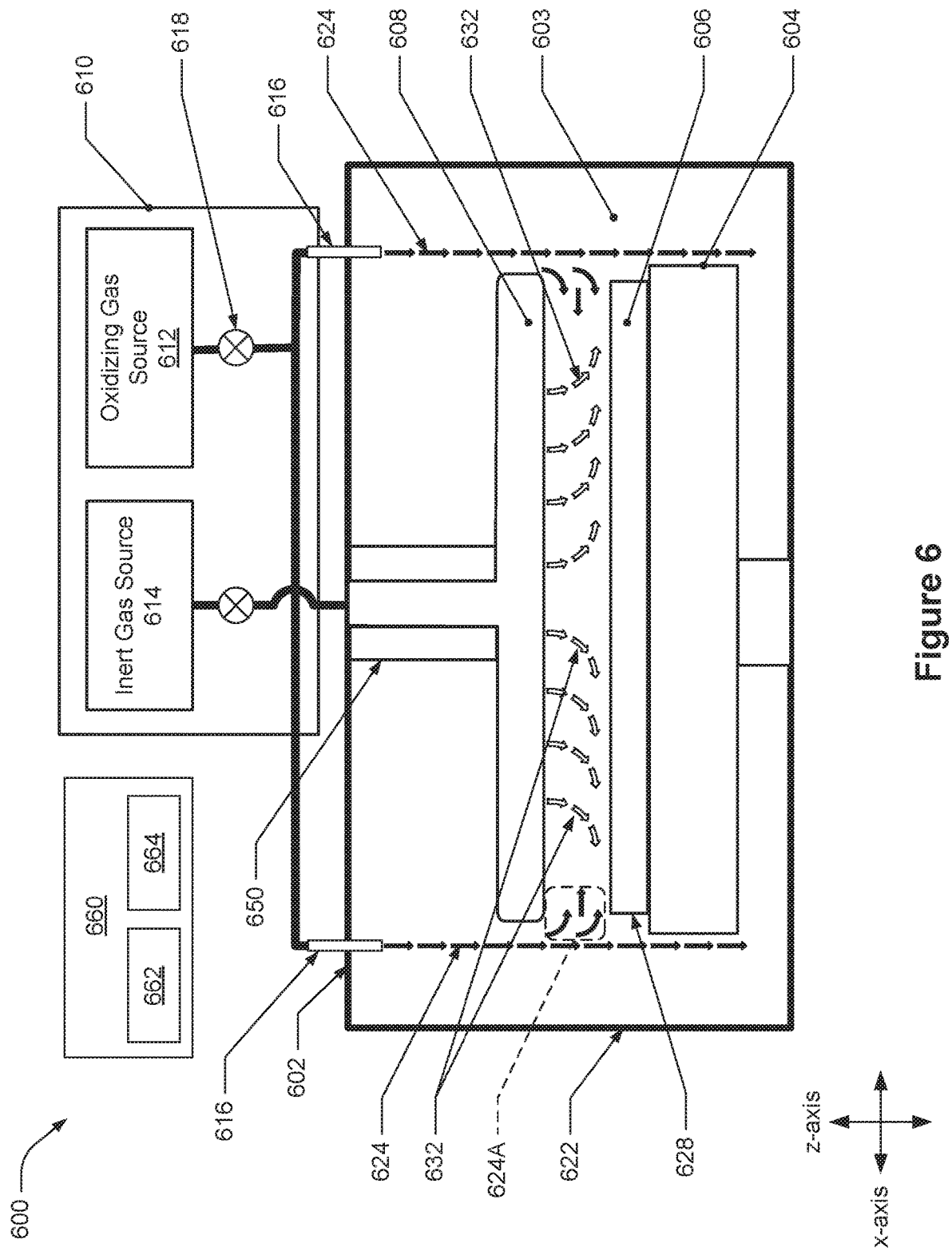
FIG. 6 depicts yet another example schematic of a substrate processing apparatus.

Similarly, FIG. 6 depicts yet another example schematic of a substrate processing apparatus. The top of the processing chamber 602 in this apparatus may have gas injection ports 616 that are fluidically connected to oxidizing gas source 612 that are configured to flow the oxidizing gas 624 into the processing chamber 602. FIG. 6 is intended to show the general concept of oxidizing gas flowing from the processing chamber body, e.g. the top of the processing chamber, and therefore, some of the features depicted are similar and/or identical to those in the other features and some have been omitted for illustrative purposes. These gas injection ports 616 may be orifices arranged in a circular pattern with a diameter larger than or equal to that of the diameter of the showerhead 608. In some instances, the gas injection ports 616 may be holes, slots, or nozzles. In some other embodiments, the diameter of the circular pattern may be less than the diameter of the showerhead 608. In some other embodiments, the gas injection ports 616 may be a single slot or hole arranged in a circular pattern around the showerhead 608. In this embodiment, the periphery gas flow unit includes the gas injection ports. The gas flow in these embodiments may be in a downwards vertical direction in the z-axis with minimal to no horizontal flow across the top of the showerhead. Similar to FIGS. 5 and 1, the oxidizing gas 624 of FIG. 6 flows radially inwards through diffusion as indicated with the arrows encircled by region 624A. The oxidizing gas here flows uniformly around the showerhead so that a uniform curtain of oxidizing gas forms and flows around the substrate holder-showerhead gap 591, the substrate 506, and the substrate holder 504. In some embodiments, as described above, the formation of the annular gas region may be enabled by the simultaneous evacuation of the chamber with the pump (not depicted).

Figure 7:
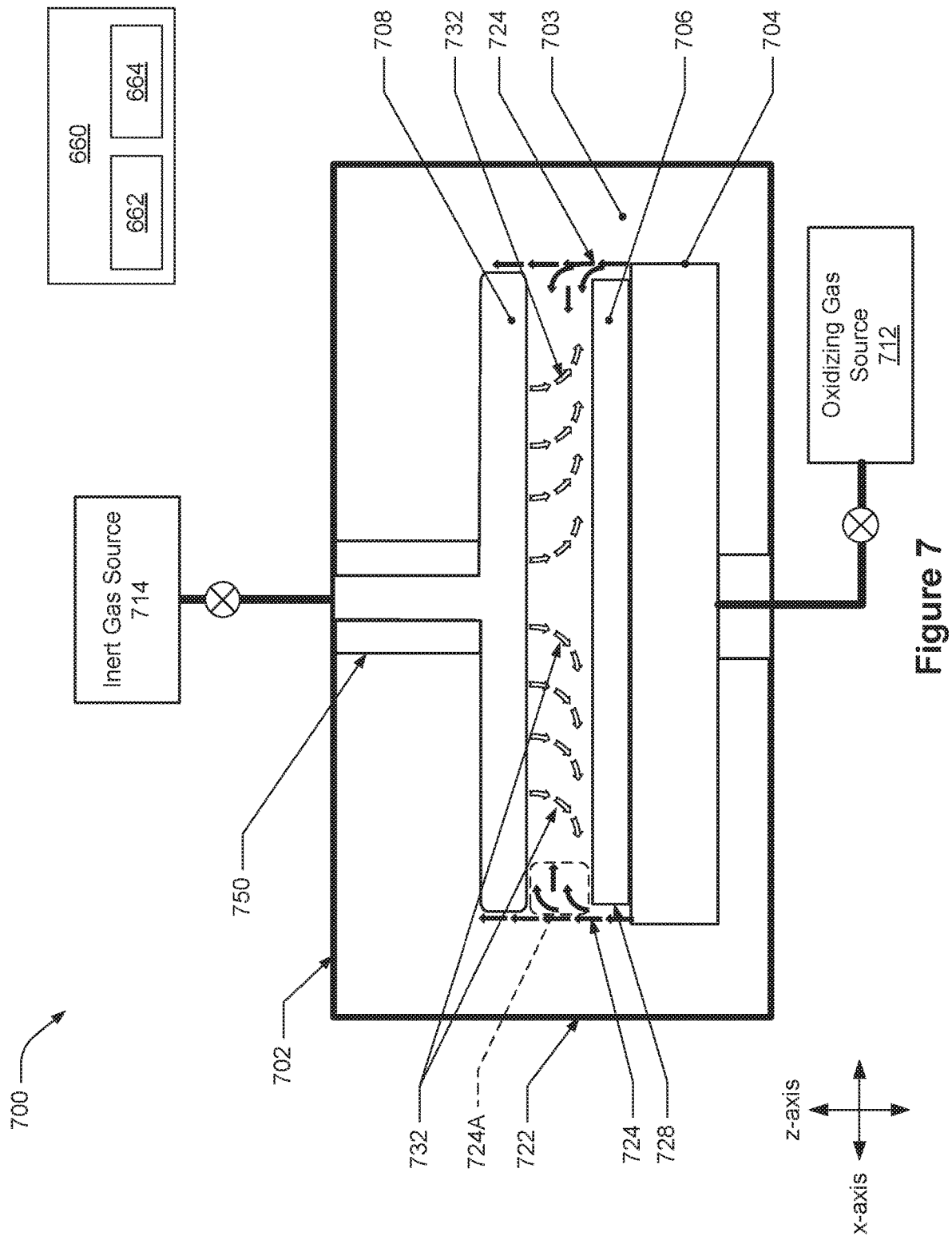
FIG. 7 depicts another example schematic of a substrate processing apparatus.

FIG. 7 depicts another example schematic of a substrate processing apparatus and includes an apparatus 700 with a substrate holder 708 as well as some of the features described and included herein. The substrate holder 708 is fluidically connected to oxidizing gas source 712 and is configured to flow oxidizing gas 724 into the processing chamber 702. FIG. 7 is intended to show the general concept of oxidizing gas flowing from the substrate holder 708. The configuration of the substrate holder 708 may include holes, slots, or nozzles configured to flow the oxidizing gas out of the substrate holder 708. In this embodiment, the periphery gas flow unit includes the features configured to flow the oxidizing gas out of the substrate holder. Here, the oxidizing gas 724 again flows radially inwards through diffusion as indicated with the arrows encircled by region 724A. The oxidizing gas in FIG. 7 flows uniformly around the showerhead so that a uniform curtain of oxidizing gas forms and flows around the substrate holder-showerhead gap, the substrate, and the substrate holder.

In some embodiments, the semiconductor processing apparatuses described herein may have a controller with program instructions for executing any and all of the example techniques described herein. For example, the tools of FIGS. 1 and 5 through 7 may have a controller for performing any and all of the example techniques provided above. This includes controlling the flow and flow rates of the oxidizing gas and the inert gas, as well as the temperature of the substrate holder. For instance, the controller may have program instructions to control the valves and other flow control devices (e.g., mass flow controllers) to control the gas flows. The controller may also have program instructions for providing the substrate to the substrate holder such that the substrate is directly or indirectly supported by the substrate holder, raising and lowering the lift pins of the substrate holder, and simultaneously flowing the oxidizing gas around the periphery of the substrate and the inert gas through the showerhead and onto the substrate.

The semiconductor processing apparatuses described herein may have also have features and a controller with program instructions for performing deposition of a material onto the substrate after performing the example techniques. Deposition techniques provided herein may be implemented in a plasma enhanced chemical vapor deposition (PECVD) chamber or a conformal film deposition (CFD) chamber or in some embodiments, an atomic layer deposition (ALD) chamber. Such a chamber may take many forms, and may be part of an apparatus that includes one or more chambers or reactors (sometimes including multiple stations) such as described in further detail with respect to FIG. 9 that may each house one or more substrate or wafer and may be configured to perform various substrate processing operations. The one or more chambers may maintain the substrate in a defined position or positions (with or without motion within that position, e.g., rotation, vibration, or other agitation). In one implementation, a substrate undergoing film deposition may be transferred from one station to another within a chamber (or from one chamber to another within an apparatus) during the process. In other implementations, the substrate may be transferred from chamber to chamber within the apparatus to perform different operations, such as UV exposure operations, etching operations, or lithography operations. The full film deposition may occur entirely at a single station or any fraction of the total film thickness for any deposition step. While in process, each substrate may be held in place by a pedestal, substrate chuck, and/or other substrate-holding apparatus. For certain operations in which the substrate is to be heated, the apparatus may include a heater, such as a heating plate.

Figure 8:
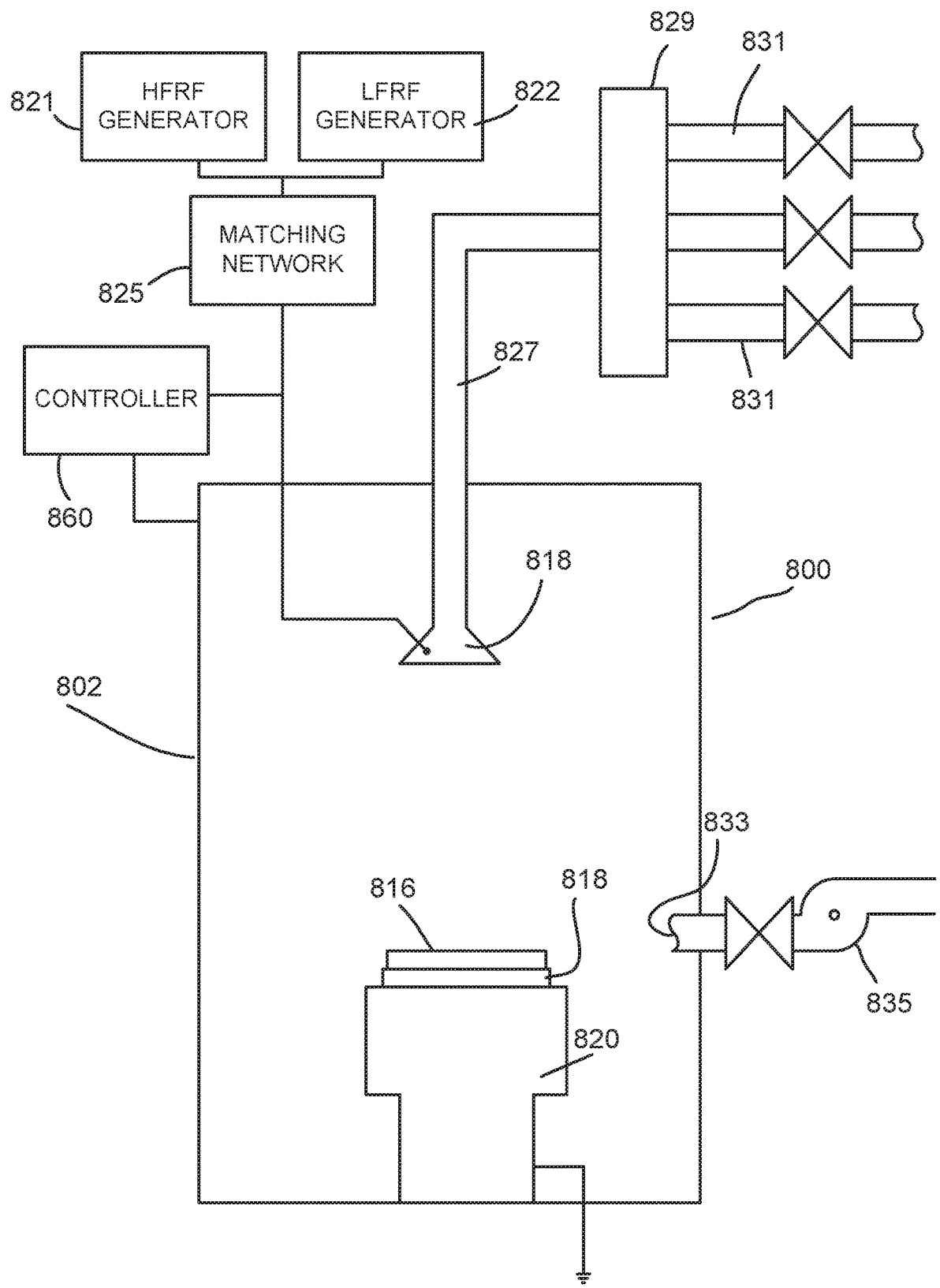
FIG. 8 provides a simple block diagram depicting various reactor components arranged for implementing methods described herein.

FIG. 8 provides a simple block diagram depicting various reactor components arranged for implementing methods described herein. Reactor 800 may be used to deposit layers as described herein. As shown, a reactor 800 includes a process chamber 802 that encloses other components of the reactor and serves to contain a plasma generated by a capacitive-discharge type system including a showerhead 818 working in conjunction with a grounded heater block 820. A high frequency (HF) radio frequency (RF) generator 821 and a low frequency (LF) RF generator 823 may be connected to a matching network 825 and to the showerhead 818. The power and frequency supplied by matching network 825 may be sufficient to generate a plasma from process gases supplied to the process chamber 802. For example, the matching network 825 may provide 100 W to 1000 W of power. The HFRF component may generally be between 1 MHz to 100 MHz, e.g., 13.56 MHz. In operations where there is an LF component, the LF component may be from less than about 1 MHz, e.g., 100 kHz. In some embodiments, the plasma may be pulsed for a pulse frequency between about 300 Hz and about 1.5 kHz, such as about 500 Hz for a duty cycle. Controller 860 may be configured to set the duration of each plasma pulse to a duration of about 0.01 ms to about 5 ms, such as between about 0.05 ms and about 1.9 ms. In some embodiments, the plasma may be turned on for periodic plasma treatment as a post-treatment as described herein. For periodic plasma treatment, the plasma may be turned on for a duration between about 10 seconds and about 50 seconds.

Within the reactor 800, the substrate support 808 (may support a substrate 806. The substrate support 808 may include a chuck, a fork, or lift pins (not shown) to hold and transfer the substrate 806 during and between the deposition and/or pre/post-treatment operations. The chuck may be an electrostatic chuck, a mechanical chuck, or various other types of chuck as are available for use in the industry and/or for research.

Various process gases may be introduced via inlet 827. For example, gases may include a Group IV-containing precursor such as a silicon-containing precursor or a germanium-containing precursor. Gases may include a reactant, such as a nitrogen-containing reactant (such as nitrogen or ammonia), a carbon-containing reactant, an oxygen-containing reactant, an oxygen-and-carbon-containing reactant, and combinations thereof. In some embodiments, inert gases or carrier gases may also be flowed. Example inert gases include argon, helium, nitrogen, and ammonia. In some embodiments, carrier gases are diverted prior to delivering process gases to the process chamber 802.

Multiple source gas lines 829 are connected to manifold 831. The gases may be premixed or not. Appropriate valving and mass flow control mechanisms may be employed to ensure that the correct process gases are delivered during the deposition and post-treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the process chamber 802.

Any of the gases in the chamber 802, may exit the process chamber 802 via an outlet 833. A vacuum pump 835, e.g., a one or two stage mechanical dry pump and/or turbomolecular pump, may be used to draw process gases out of the process chamber 802 and to maintain a suitably low pressure within the process chamber 802 by using a closed-loop-controlled flow restriction device, such as a throttle valve or a pendulum valve.

Apparatus 800 includes a controller 860 which may include one or more memory devices, one or more mass storage devices, and one or more processors. The processor may include a CPU or computer, analog and/or digital input/output connections, stepper motor controller boards, etc. The apparatus 800 includes system controller 860 employed to control process conditions and hardware states of process tool 800. The controller 860 may be configured to deliver certain process gases at various flow rates for certain durations and control plasma frequency, plasma pulse frequency, plasma power, and other process conditions as described herein. The controller 860 may be configured to turn the plasma on and off in accordance with some embodiments. The controller 860 may have any of the characteristics of controller 860 described below with respect to FIG. 9.

Figure 9:
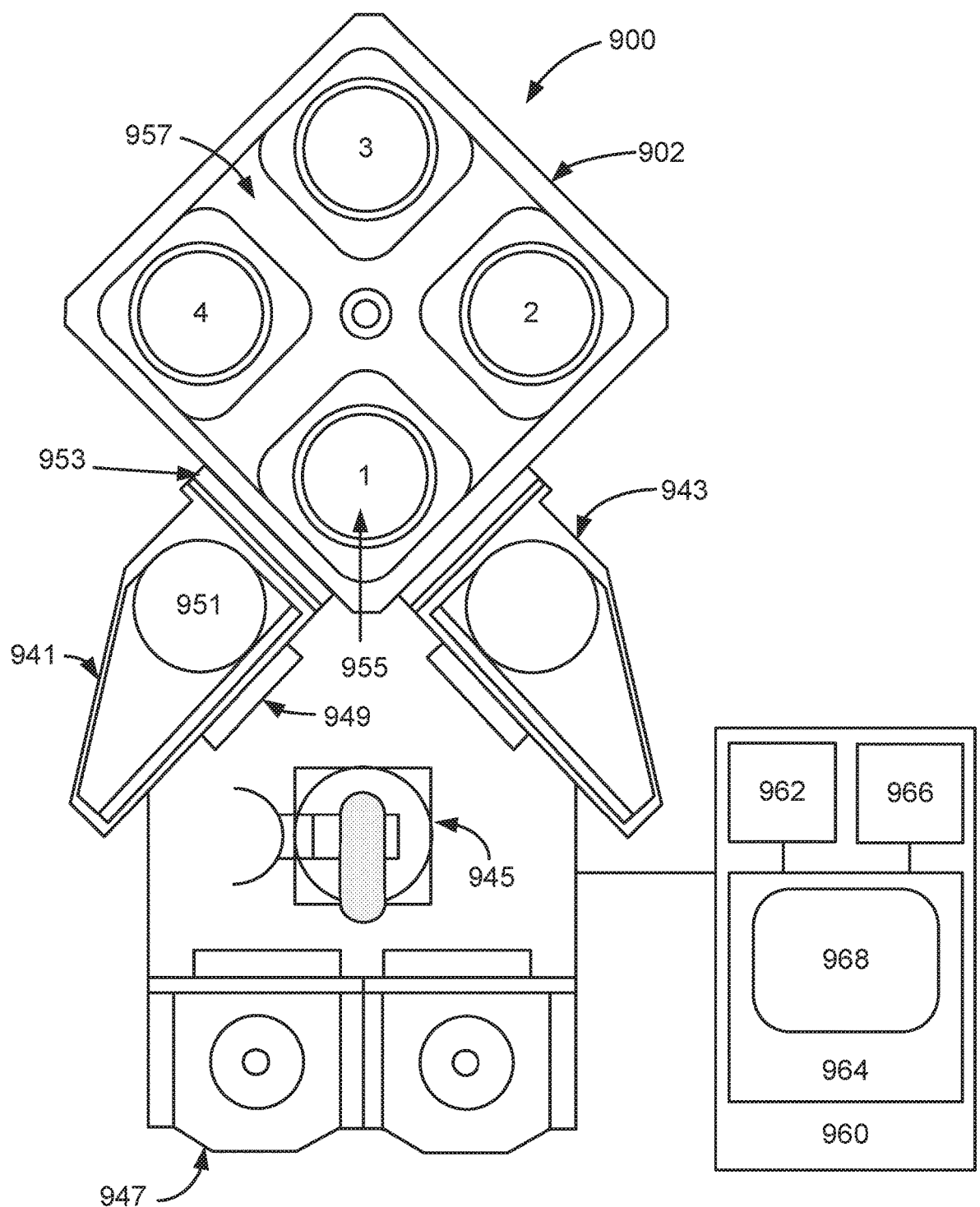
FIG. 9 is a schematic illustration of an example multi-station tool.

The techniques for pre-treatment and deposition as discussed herein may be implemented on a multi-station or single station tool. FIGS. 1, 5-7, and 8 depict example single station tools while FIG. 9 is a schematic illustration of an example multi-station tool. In specific implementations, a 300 mm Lam Vector™ tool having a 4-station deposition scheme or a 200 mm Sequel™ tool having a 6-station deposition scheme may be used. In some implementations, tools for processing 450 mm substrates may be used. In various implementations, the substrates may be indexed after every deposition and/or post-deposition plasma treatment, or may be indexed after etching steps if the etching chambers or stations are also part of the same tool, or multiple depositions and treatments may be conducted at a single station before indexing substrates.

FIG. 9 shows a schematic view of an embodiment of a multi-station processing tool 900 with an inbound load lock 941 and an outbound load lock 943, either or both of which may include a remote plasma source. A robot 945, at atmospheric pressure, is configured to move wafers from a cassette loaded through a pod 947 into inbound load lock 941 via an atmospheric port 949. A wafer is placed by the robot 945 on a pedestal 951 in the inbound load lock 941, the atmospheric port 949 is closed, and the load lock 941 is pumped down. Where the inbound load lock 941 includes a remote plasma source, the wafer may be exposed to a remote plasma treatment in the inbound load lock 941 prior to being introduced into a processing chamber 902. Further, the wafer also may be heated in the inbound load lock 941 as well, for example, to remove moisture and adsorbed gases. In some embodiments, the wafer may be subject to a "temperature soak" as described elsewhere herein in the inbound load lock 941.

A chamber transport port 953 to processing chamber 902 is opened, and another robot (not shown) places the wafer into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 902 includes four process stations, numbered from 1 to 4 in the embodiment shown in FIG. 9. Each station has a heated pedestal (shown at 955 for station 1), and gas line inlets. It will be appreciated that in some embodiments, each process station may have different or multiple purposes. For example, in some embodiments, a process station may be switchable between a pulsed plasma PECVD deposition mode and a periodic plasma post-treatment process mode. In some embodiments, a process station may be switchable between a chemical vapor deposition (CVD) process mode and a plasma enhanced chemical vapor deposition (PECVD) process mode. Additionally or alternatively, in some embodiments, processing chamber 902 may include one or more matched pairs of posts plasma PECVD process stations. While the depicted processing chamber 902 includes four stations, it will be understood that a processing chamber according to certain disclosed embodiments may have any suitable number of stations. For example, in some embodiments, a processing chamber may have five or more stations, while in other embodiments a processing chamber may have three or fewer stations.

FIG. 9 depicts an embodiment of a wafer handling system 957 for transferring wafers within processing chamber 902.

In some embodiments, wafer handling system 957 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 960 employed to control process conditions and hardware states of process tool 900. System controller 960 may include one or more memory devices 964, one or more mass storage devices 966, and one or more processors 962. One or more processors 962 may include a CPU or computer, analog and/or digital input/output connections, stepper motor controller boards, etc.

In some embodiments, system controller 960 controls all of the activities of process tool 900. System controller 960 executes system control software 968 stored in mass storage device 964, loaded into memory device 966, and executed on processor 962. Alternatively, the control logic may be hard coded in the controller 960. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 968 may include instructions for controlling the timing, mixture of gases, amount of gas flow, chamber and/or station pressure, chamber and/or station temperature, wafer temperature, target power levels, RF power levels, substrate pedestal, chuck and/or susceptor position, plasma pulse frequency, plasma exposure duration, and other parameters of a particular process performed by process tool 900. System control software 968 may be configured in any suitable way. For example, various process tool component subroutines or control objects may be written to control operation of the process tool components necessary to carry out various process tool processes. System control software 968 may be coded in any suitable computer readable programming language.

In some embodiments, system control software 968 may include input/output control (IOC) sequencing instructions for controlling the various parameters described above. Other computer software and/or programs stored on mass storage device 964 and/or memory device 966 associated with system controller 960 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal and to control the spacing between the substrate and other parts of process tool.

A process gas control program may include code for controlling gas composition (e.g., silicon-containing gases, germanium-containing gases, nitrogen-containing gases, carbon-containing gases, oxygen-and-carbon-containing gases, and carbon-containing gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 960. The user interface may include a display screen, graphical software displays of the apparatus and/or process conditions, and user input devices such as pointing devices, keyboards, touch screens, microphones, etc.

In some embodiments, parameters adjusted by system controller 960 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 960 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 960 may provide program instructions for implementing the above-described deposition processes. The program instructions may control a variety of process parameters, such as DC power level, RF bias power level, pressure, temperature, plasma pulse frequency, plasma exposure duration, UV exposure duration, etc. The instructions may control the parameters to operate in-situ deposition of film stacks according to various embodiments described herein.

The system controller 960 will typically include one or more memory devices and one or more processors configured to execute the instructions so that the apparatus will perform a method in accordance with disclosed embodiments. Machine-readable, non-transitory media containing instructions for controlling process operations in accordance with disclosed embodiments may be coupled to the system controller 960.

In some implementations, a controller 960 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, plasma pulse frequency settings, fluid delivery settings, positional and operation settings, wafer transfers into and out of a tool and other transfer tools and/or load locks connected to or interfaced with a specific system.

Broadly speaking, the controller 960 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 960, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 960 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 960 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, an apparatus may be provided that is configured to perform the techniques described herein. A suitable apparatus may include hardware for performing various process operations as well as a system controller 960 having instructions for controlling process operations in accordance with the disclosed embodiments. The system controller 960 will typically include one or more memory devices and one or more processors communicatively connected with various process control equipment, e.g., valves, RF generators, substrate handling systems, etc., and configured to execute the instructions so that the apparatus will perform a technique in accordance with the disclosed embodiments, e.g., a technique such as that provided in the operations of FIGS. 3 and 4. Machine-readable, non-transitory media containing instructions for controlling process operations in accordance with the present disclosure may be coupled to the system controller 960. The controller 960 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 960 may control all of the activities of the reactor 900. The system controller 960 may execute system control software stored in a mass storage device, loaded into a memory device, and executed on a processor. The system control software may include instructions for controlling the timing of gas flows, substrate movement, RF generator activation, etc., as well as instructions for controlling the mixture of gases, the chamber and/or station pressure, the chamber and/or station temperature, the substrate temperature, the target power levels, the RF power levels, the substrate pedestal, chuck, and/or susceptor position, and other parameters of a particular process performed by the reactor apparatus 900. For example, the software may include instructions or code for controlling the flow rate of a silicon-containing precursor, the flow rate of a reactant, plasma frequency, plasma pulse frequency, plasma power, and precursor and reactant exposure times for each of the above described flow chemistries. The system control software may be configured in any suitable way. For example, various process tool component subroutines or control objects may be written to control operation of the process tool components necessary to carry out various process tool processes. The system control software may be coded in any suitable computer readable programming language.

The system controller 960 may typically include one or more memory devices 964 and one or more processors 962 configured to execute the instructions so that the apparatus will perform a technique in accordance with disclosed embodiments. Machine-readable, non-transitory media containing instructions for controlling process operations in accordance with disclosed embodiments may be coupled to the system controller 960.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatuses and processes described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Experimental Results

Figure 10:
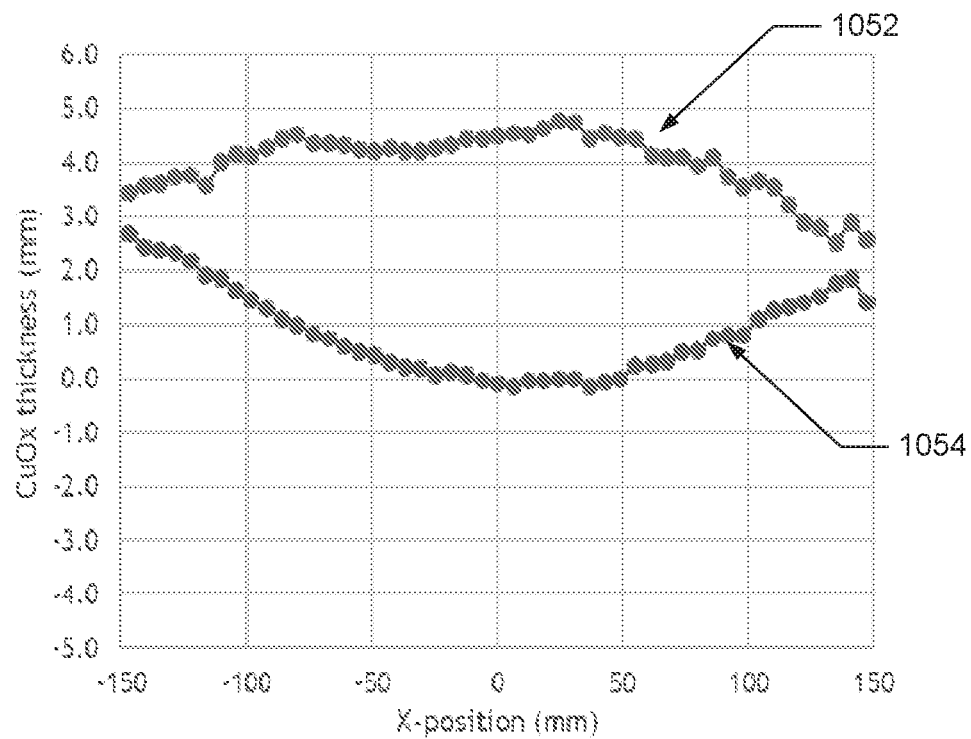
FIG. 10 depicts a graph of various oxidization thicknesses on two substrates.

As described above, the present inventors found that simultaneously flowing the oxidizing gas around the periphery of the substrate and the inert gas through the showerhead can create a higher oxidization area around and on the annular edge region of the wafer. FIG. 10 depicts a graph of various oxidization thicknesses on two substrates. The vertical axis is the copper oxidization thickness in Angstroms while the horizontal axis is the radial distance along the substrate from the substrate center; the substrate center point, 0, is in the middle of the graph. In a first experiment, the data from which is labeled with identifier 1052, a substrate was positioned in a chamber similar to that of FIG. 1, supported by the substrate holder, and an oxidizing gas was flowed only through the showerhead above the substrate while the chamber was evacuated by a pump and held at a low pressure. As can be seen, the oxidization profile of the substrate has a concave shape with the highest oxidization occurring at the center of the substrate and the lowest at the edge of the substrate. Flowing the oxidizing gas in this matter may be less advantageous for oxidizing the edge region of the substrate because in order to oxidize the outer annular region for the desired amount, this flowing causes over-oxidization of the substrate center and interior. In a second experiment, the data from which is labeled with identifier 1054, another substrate was positioned in the chamber similar to that of FIG. 1, supported by the substrate holder, and the simultaneous flow of an inert gas through the showerhead and an oxidizing gas around the periphery of the substrate was performed while the chamber was being evacuated by the pump and held at a low pressure. As can be seen, the overall shape of the oxidization flipped from the first experiment 1052 to a convex shape that has the highest oxidization rate at the outer edge of the substrate and the lowest oxidization in the substrate center. Accordingly, simultaneously flowing the oxidizing and inert gases in accordance with the disclosed techniques provides for a more advantageous oxidization profile for selectively oxidizing an outer edge annular region of the substrate.

Figure 11:
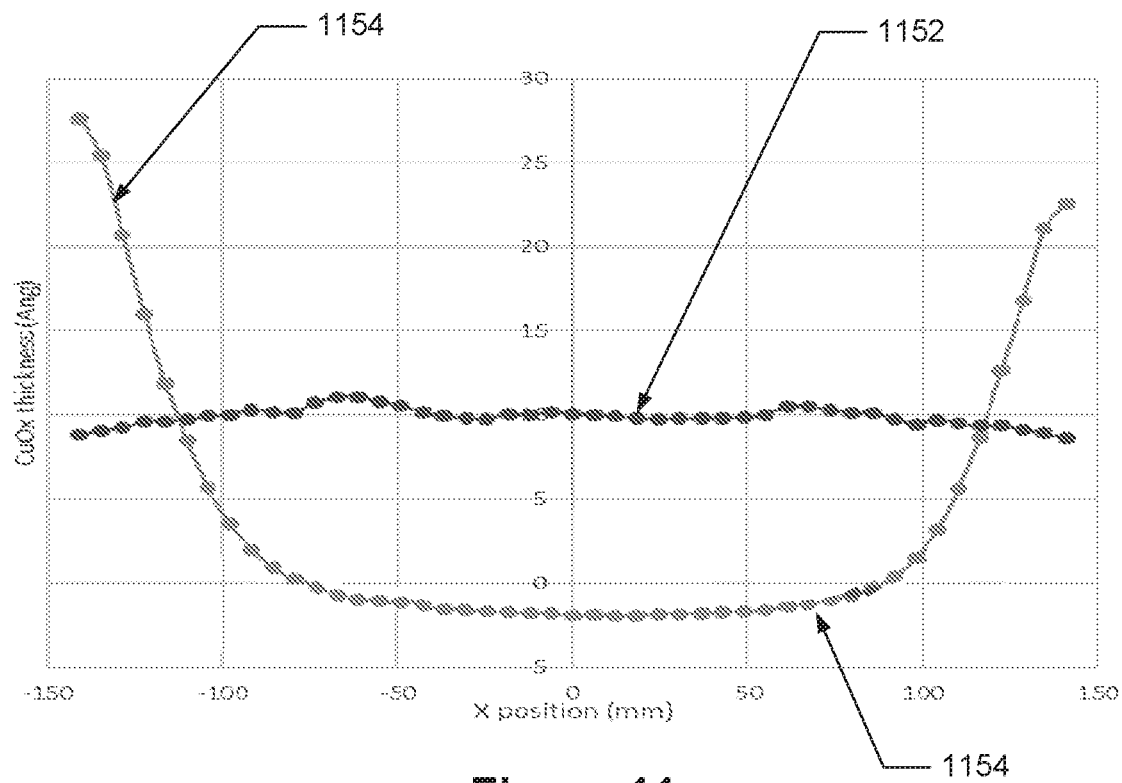
FIG. 11 depicts another graph of various oxidization thicknesses on two substrates.

FIG. 11 depicts another graph of various oxidization thicknesses on two substrates. The vertical axis again is the copper oxidization thickness in Angstroms while the horizontal axis is the radial distance along the substrate from the substrate center; the substrate center point, 0, is in the middle of the graph. Similar to FIG. 10, a first experiment 1152 was performed in which a substrate was positioned in a chamber similar to that of FIG. 1, supported by the substrate holder, and an oxidizing gas was flowed through both the showerhead above the substrate and onto the baffle plate above of the showerhead (which therefore caused the oxidizing gas to flow around the periphery of the substrate) while the chamber was being evacuated by the pump and held at a low pressure. As can be seen, the oxidization profile of the substrate has a generally constant, flat profile shape. Flowing the oxidizing gas in this matter may be less advantageous for oxidizing the edge region of the substrate because in order to oxidize the outer annular region for the desired amount, this flowing again causes over-oxidization of the substrate center and interior. As stated herein, it is desirable to selectively oxidize the annular region of the substrate without oxidizing or over-oxidizing the substrate interior. In a second experiment 1154, as with 1054, another substrate was positioned in the chamber similar to that of FIG. 1, supported by the substrate holder, and the simultaneous flow of an inert gas through the showerhead and an oxidizing gas around the periphery of the substrate was performed while the chamber was being evacuated by the pump and held at a low pressure. As can be seen, the overall shape of the oxidization has a convex shape with the highest oxidization rate at the outer edge of the substrate and the lowest oxidization in the substrate center. Accordingly, simultaneously flowing the oxidizing and inert gases in accordance with the techniques disclosed herein provides for a more advantageous oxidization profile for selectively oxidizing an outer edge annular region of the substrate.

Figure 12:
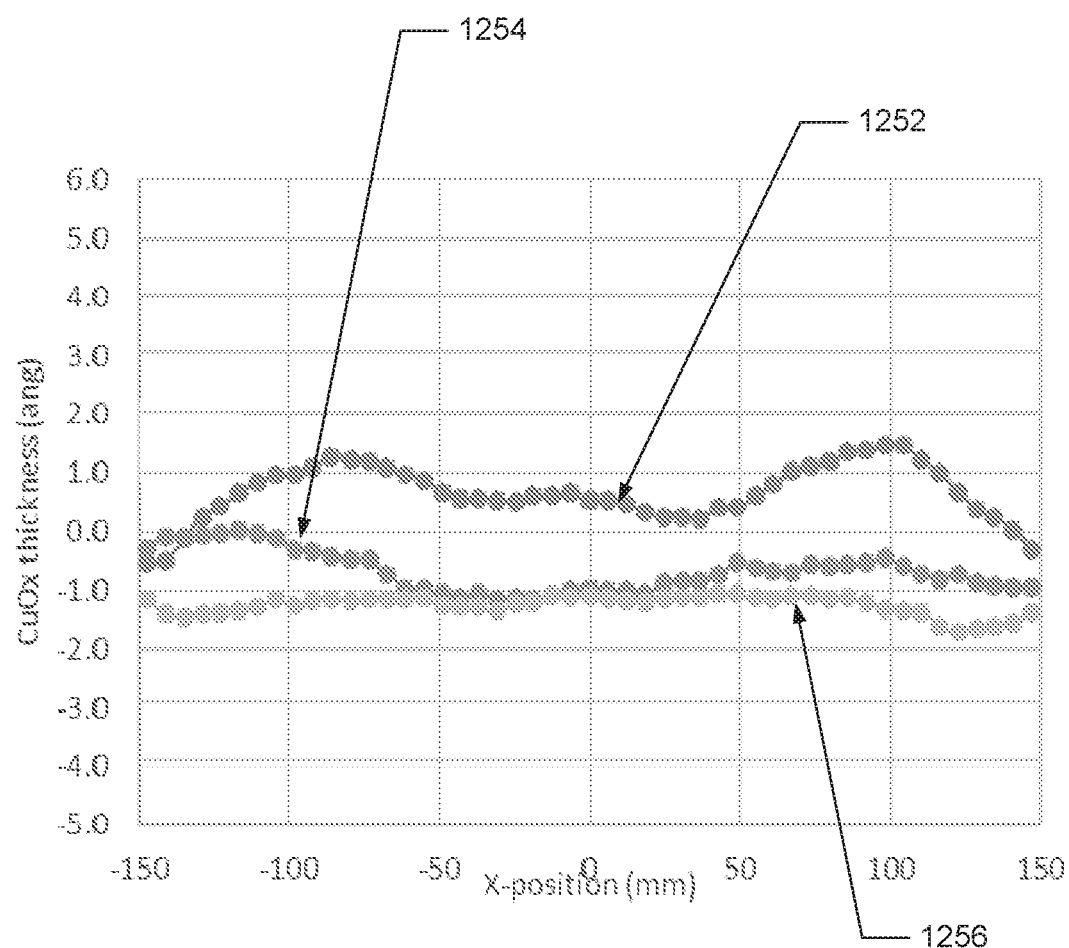
FIG. 12 depicts a graph of various oxidization thicknesses on a substrate.

As stated above, the flowrates of the inert and/or oxidizing gases may affect the size and shape of the oxidization regions and the resulting oxidization profile on the substrate. For example, as depicted in FIG. 12, which depicts a graph of various oxidization thicknesses on a substrate, increasing the inert gas flowrate as compared to the oxidizing gas flowrate reduced the oxidization profile in the annular edge region. In FIG. 12, as in FIGS. 10 and 11, the vertical axis is the copper oxidization thickness in Angstroms while the horizontal axis is the radial distance along the substrate from the substrate center; the substrate center point, 0, is in the middle of the graph. In FIG. 12, three different experiments on three different substrates were performed and in each experiment, a different substrate was positioned in the chamber similar to that of FIG. 1, supported by the substrate holder, and the simultaneous flow of an inert gas through the showerhead and an oxidizing gas around the periphery of the substrate was performed while the chamber was being evacuated by the pump and held at a low pressure; the difference in each experiment was a change in the inert gas flowrate, the remaining conditions remained the same, including maintaining the same oxidizing gas flowrate. The first experiment 1252 had the lowest the inert gas flowrate of 500 sccm, the second experiment 1254 had the middle inert gas flowrate of 1,000 sccm, and the third experiment 1256 has the highest inert gas flowrate of 2,000 sccm; the oxidizing gas of pure molecular oxygen was at 500 sccm in all three experiments. As shown in this Figure, increasing the inert gas flowrate decreased the oxidization rate and area, with the center decreasing first then proceeding out across the wafer towards the edge.

The term "wafer," as used herein, may refer to semiconductor wafers or substrates or other similar types of wafers or substrates.

It is also to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method for oxidizing an annular edge region of a substrate, the method comprising:
providing the substrate to a substrate holder in a semiconductor processing chamber, the semiconductor processing chamber having a showerhead positioned above the substrate holder; and
simultaneously flowing, while the substrate is supported by the substrate holder, (a) an oxidizing gas around a periphery of the substrate and (b) an inert gas that does not include oxygen through the showerhead and onto the substrate, thereby creating an annular gas region over an annular edge region of the substrate and an interior gas region over on an interior region of the substrate, wherein:
the simultaneous flowing is not during a deposition of a material onto the substrate, and
the annular gas region has an oxidization rate higher than the interior gas region.

2. The method of claim 1, further comprising evacuating, during the simultaneous flowing of the oxidizing gas and the inert gas, gases from the bottom of the semiconductor processing chamber.

3. The method of claim 1, wherein the oxidizing gas consists of oxygen.

4. The method of claim 1, wherein the oxidizing gas comprises oxygen and a second inert gas.

5. The method of claim 4, wherein the second inert gas is selected from the group consisting of: argon, helium, nitrogen, and a combination of two or more thereof.

6. The method of claim 1, wherein the inert gas is selected from the group consisting of: argon, helium, nitrogen, and a combination thereof.

7. The method of claim 1, further comprising, heating, during the simultaneous flowing, the substrate to a first temperature.

8. The method of claim 7, wherein the first temperature is at least 20° C.

9. The method of claim 1, further comprising flowing, before the simultaneous flowing, the inert gas through the showerhead and onto the substrate while the oxidizing gas is not flowing.

10. The method of claim 1, wherein during the simultaneous flowing:
a flowrate of the oxidizing gas is at least 500 standard cubic centimeters per minute (sccm), and
a flowrate of the inert gas is at least 250 sccm.

11. The method of claim 10, wherein during the simultaneous flowing the flowrate of the inert gas is at least 500 sccm.

12. The method of claim 1, wherein the simultaneous flowing is not:
during a chemical vapor deposition process, or
during a dose, purge, or activation step of atomic layer deposition.

13. The method of claim 1, wherein flowing the oxidizing gas further comprises flowing the oxidizing gas onto a baffle plate positioned vertically between a top of the semiconductor processing chamber and the showerhead.

14. The method of claim 1, further comprising:
purging, after the simultaneous flowing, the semiconductor processing chamber of the oxidizing gas; and
performing, after the purging, one or more deposition operations on the substrate.

15. A semiconductor processing system comprising:
a processing chamber;
a gas delivery system with an inert gas inlet configured to be fluidically connectable with an inert gas source, an oxidizing gas inlet configured to be fluidically connectable with an oxidizing gas source, and one or more valves configured to control flow of the inert gas and the oxidizing gas;
a substrate holder configured to support a substrate;

a showerhead positioned above the substrate holder and fluidically connected to the inert gas inlet;

a substrate handling robot configured to provide the substrate to the substrate holder;

a periphery gas flow unit configured to cause an oxidizing gas supplied via the oxidizing gas inlet to flow around a periphery of the substrate holder, the periphery gas flow unit fluidically connected to the oxidizing gas inlet; and a controller comprising machine-readable, non-transitory media containing instructions for:

causing the substrate handling robot to provide the substrate to the substrate holder such that the substrate is directly or indirectly supported by the substrate holder, and causing, while the substrate is supported by the substrate holder, the one or more valves to cause a simultaneous flow of (a) the oxidizing gas around the periphery of the substrate and (b) an inert gas that does not contain oxygen through the showerhead and onto the substrate, to thereby create an annular gas region over an annular edge region of the substrate and an interior gas region over an interior region of the substrate wherein:

the simultaneous flow is not during a deposition of a material onto the substrate, and the annular gas region has an oxidization rate higher than the interior gas region.

16. The semiconductor processing system of claim 15, further comprising a pump configured to evacuate gases from the bottom of the processing chamber, wherein the controller further comprises instructions for causing the pump to evacuate, during the simultaneous flowing, gases from the processing chamber.

17. The semiconductor processing system of claim 16, wherein the controller further comprises instructions for:

causing the pump to evacuate, after the simultaneous flowing, gases from the processing chamber; and causing the system to perform, after the evacuation, one or more deposition operations on the substrate.

18. The semiconductor processing system of claim 15, wherein:

the substrate holder further comprises a heater configured to heat the substrate positioned on the substrate holder, and the controller further comprises instructions for heating the substrate during the simultaneous flowing and while the substrate is positioned on substrate holder.

19. The semiconductor processing system of claim 18, wherein the heater is configured to heat the substrate to at least 20° C.

20. The semiconductor processing system of claim 15, wherein the controller further comprises instructions for flowing, before the simultaneous flowing, the inert gas through the showerhead and onto the substrate.

21. The semiconductor processing system of claim 15, wherein the inert gas is selected from the group consisting of: argon, helium, nitrogen, and a combination thereof.

22. The semiconductor processing system of claim 15, wherein the gas delivery system is configured to:

flow the oxidizing gas into the processing chamber at a flowrate of at least 500 standard cubic centimeters per minute (sccm), and flow the inert gas out of the showerhead at a flowrate of at least 250 sccm.

* * * * *